(12) United States Patent
Liu et al.

(10) Patent No.: US 12,347,131 B2
(45) Date of Patent: Jul. 1, 2025

(54) IMAGE SEGMENTATION APPARATUS, IMAGE SEGMENTATION METHOD, AND MAGNETIC RESONANCE IMAGING APPARATUS

(71) Applicant: CANON MEDICAL SYSTEMS CORPORATION, Tochigi (JP)

(72) Inventors: Ye Liu, Beijing (CN); Zhe Huang, Beijing (CN)

(73) Assignee: CANON MEDICAL SYSTEMS CORPORATION, Tochigi (JP)

( * ) Notice: Subject to any disclaimer, the term of this patent is extended or adjusted under 35 U.S.C. 154(b) by 362 days.

(21) Appl. No.: 17/819,462

(22) Filed: Aug. 12, 2022

(65) Prior Publication Data
US 2023/0059426 A1 Feb. 23, 2023

(30) Foreign Application Priority Data

Aug. 20, 2021 (CN) .......................... 202110959593.4

(51) Int. Cl.
G06T 7/73 (2017.01)
G06T 7/11 (2017.01)
G06T 7/174 (2017.01)
(52) U.S. Cl.
CPC ................ G06T 7/73 (2017.01); G06T 7/11 (2017.01); G06T 7/174 (2017.01);
(Continued)
(58) Field of Classification Search
CPC .......................... G16H 30/40; A61B 2576/026; A61B 5/0037; A61B 5/0042; A61B 5/055; A61B 5/4528; A61B 5/4533; A61B 6/03; G01R 33/4833; G01R 33/543; G01R 33/546; G06F 18/2431; G06N 3/04; G06N 3/045; G06N 3/08; G06N 5/01; G06T 2200/04; G06T 2207/10081; G06T 2207/10088;
(Continued)

(56) References Cited

U.S. PATENT DOCUMENTS 8,693,760 B2    4/2014  Yokosawa et al.
9,959,486 B2 *  5/2018  Kiraly .................. G06V 30/194
                         (Continued)

FOREIGN PATENT DOCUMENTS

CN      105678746 B    4/2018
JP      2007-111123 A  5/2007
                       (Continued)

Primary Examiner — Negussie Worku
(74) Attorney, Agent, or Firm — Oblon, McClelland, Maier & Neustadt, L.L.P.

(57) ABSTRACT

An image segmentation apparatus for magnetic resonance imaging according to an embodiment includes processing circuitry. The processing circuitry is configured to obtain a localizer image of an organ, the localizer image being three-dimensional or being in a plurality of layers and two-dimensional. The processing circuitry is configured to temporarily localize, on a basis of the localizer image, a segment in which the organ is present in terms of the layer direction of a plurality of slices included in the localizer image. The processing circuitry is configured to obtain a segmentation result of the organ, by performing an image segmentation process on the localizer image positioned inside the segment in which the organ is present.

17 Claims, 12 Drawing Sheets

(52) U.S. Cl.
CPC .............................. *G06T 2200/04* (2013.01);
*G06T 2207/10088* (2013.01); *G06T 2207/20021* (2013.01); *G06T 2207/20036* (2013.01); *G06T 2207/20081* (2013.01); *G06T 2207/30048* (2013.01); *G06T 2207/30056* (2013.01); *G06T 2207/30084* (2013.01)

(58) Field of Classification Search
CPC . G06T 2207/20072; G06T 2207/20081; G06T 2207/20084; G06T 2207/20116; G06T 2207/20161; G06T 2207/30056; G06T 2207/30084; G06T 2207/30096; G06T 7/11; G06T 7/149; G06T 7/162; G06T 7/174; G06T 7/187; G06T 7/194; G06V 10/25; G06V 10/26; G06V 10/454; G06V 10/7635; G06V 10/774; G06V 10/82; G06V 20/64; G06V 2201/031
USPC ......................................................... 382/156
See application file for complete search history.

(56) References Cited

U.S. PATENT DOCUMENTS

| | | | | |
|---|---|---|---|---|
| 9,990,712 | B2* | 6/2018 | Gazit | A61B 6/5211 |
| 11,238,975 | B2* | 2/2022 | El-Baz | A61B 5/0261 |
| 11,403,763 | B2* | 8/2022 | Chen | G06T 7/11 |
| 2015/0093001 | A1* | 4/2015 | Wang | G06T 7/70 |
| | | | | 382/131 |
| 2017/0071497 | A1* | 3/2017 | Yamagata | G06T 7/0012 |
| 2018/0180695 | A1* | 6/2018 | Sugiura | G01R 33/543 |
| 2019/0237186 | A1* | 8/2019 | El-Baz | G16H 30/40 |
| 2019/0392584 | A1* | 12/2019 | Song | G06T 7/11 |
| 2020/0163550 | A1* | 5/2020 | Igarashi | G16H 40/63 |
| 2020/0167912 | A1* | 5/2020 | Xu | G06V 10/26 |
| 2021/0125707 | A1* | 4/2021 | Rusko | G06N 3/045 |
| 2021/0158563 | A1* | 5/2021 | Rinck | G06T 7/70 |
| 2021/0295523 | A1 | 9/2021 | Yamazaki et al. | |
| 2022/0092786 | A1* | 3/2022 | Xu | G06T 7/187 |
| 2022/0230310 | A1* | 7/2022 | Xie | G06V 10/764 |
| 2022/0392076 | A1* | 12/2022 | Seo | G06T 7/0012 |
| 2023/0021110 | A1* | 1/2023 | Tsai | G06T 7/12 |

FOREIGN PATENT DOCUMENTS

| | | |
|---|---|---|
| JP | 2012-115434 A | 6/2012 |
| JP | 2020-109614 A | 7/2020 |

* cited by examiner

- - - - PROBE LAYERS
——— LAYERS INCLUDING LIVER

- - - PROBE LAYERS
— — LAYERS INCLUDING KIDNEYS

LAYER DICTION ← → --- PROBE LAYERS
— — LAYERS INCLUDING KIDNEYS

--- PROBE LAYERS    — — LAYERS INCLUDING KIDNEYS

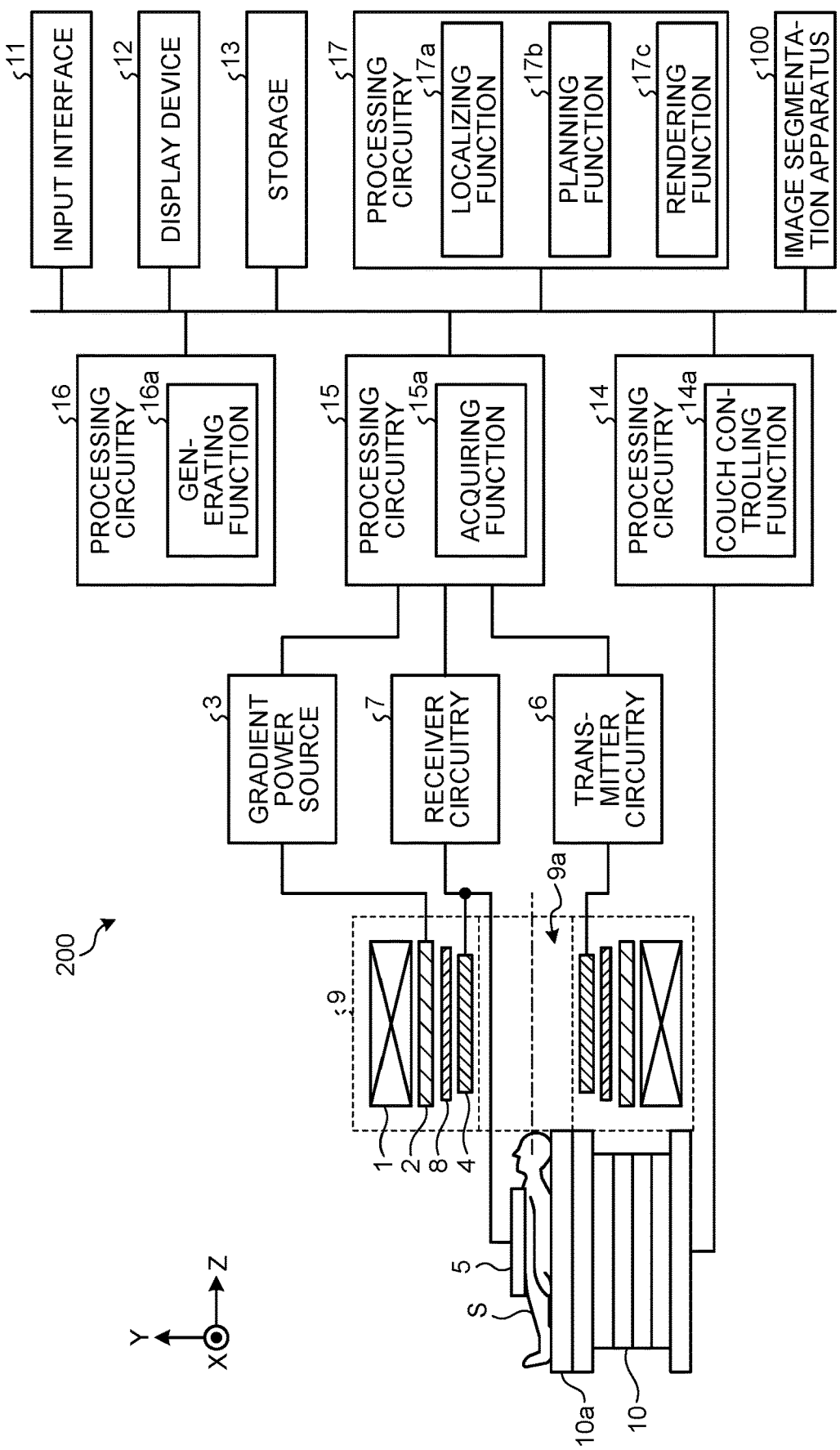

IMAGE SEGMENTATION APPARATUS, IMAGE SEGMENTATION METHOD, AND MAGNETIC RESONANCE IMAGING APPARATUS

CROSS-REFERENCE TO RELATED APPLICATIONS

This application is based upon and claims the benefit of priority from Chinese Patent Application No. 202110959593.4, filed on Aug. 20, 2021, the entire contents of all of which are incorporated herein by reference.

FIELD

Embodiments described herein relate generally to an image segmentation apparatus, an image segmentation method, and a magnetic resonance imaging apparatus.

BACKGROUND

Magnetic resonance examinations are a type of examination method in an image diagnosing process and are used in abundance in present day clinical situations. Magnetic Resonance Imaging (MRI) is an imaging method by which atomic nuclei of an examined subject placed in a static magnetic field are caused to rotate by magnetic excitation using a radio frequency signal having a Larmor frequency, so as to reconstruct an image on the basis of a Nuclear Magnetic Resonance (NMR) signal occurring due to the magnetic excitation.

In clinical situations, for example, in magnetic resonance imaging of the abdomen (the hepatobiliary and pancreatic system), it is required to provide image information of digestive organs such as the liver, the bile duct, and the pancreas. Accordingly, to scan a large number of complex organs included in the abdomen, it is necessary to perform a series of scans, while performing a contrast-agent enhanced scan with an injection of a contrast agent as necessary. The process of planning the series of scans is often carried out manually by a technologist, on the basis of personal skills and experience. Thus, the process takes time, and it is also difficult to ensure consistency and accuracy of the scan positions. In some situations, a re-scan may be necessary. Consequently, for magnetic resonance imaging of the abdomen, automating the scan planning process is clinically very worthwhile.

Conventional examples of automated scan planning techniques for magnetic resonance imaging include a method by which automated planning for the head, the spine, a knee joint, or a shoulder joint is carried out by using structural symmetry. However, because the method using the structural symmetry cannot be applied to the abdominal organs that are asymmetric, it is not possible to realize automated planning for the abdomen.

Further, for instance, conventional examples of methods for determining the position (hereinafter, "localization") of a liver region include a method by which the position of the lower edge of a rib is used instead of the lower edge of the liver. However, this method is not able to accurately express the position of the lower edge of the liver.

Furthermore, for a multi-organ scan of the abdomen, it is necessary to carry out scan planning with reference to information about the positions and the sizes of the multiple organs. For example, for a liver region, it is necessary to have information about the position of the diaphragm at the upper edge of the liver as well as the positions of the pancreas and the common bile duct. In addition, in order to realize an efficient scan in magnetic resonance imaging, and further, an automated scan, the scan planning for the abdomen is required to be accurate, standardized, and prompt. Also, because patients will be placed in the machine of a magnetic resonance imaging apparatus during a scan, it is necessary to keep the scan period as short as possible. For these reasons, the scan planning has a high requirement for time and requires detection and automated planning to be carried out within a number of seconds and also real-time. Furthermore, the scan planning requires high speed in segmenting the positions and the sizes of the organs and in the localization to determine the positions.

However, conventional techniques used for segmenting the positions and the sizes of the organs in the abdomen and for the localization take a long period of time, for example, to segment an image of the entirety of an organ (e.g., the entirety of the liver). For this reason, algorithms currently used for segmenting the positions and the sizes of the organs are not able to satisfy the abovementioned requirements.

BRIEF DESCRIPTION OF THE DRAWINGS

FIG. 18 is a schematic diagram illustrating an exemplary configuration of a magnetic resonance imaging apparatus according to a fourth embodiment.

DETAILED DESCRIPTION

Figure 1:
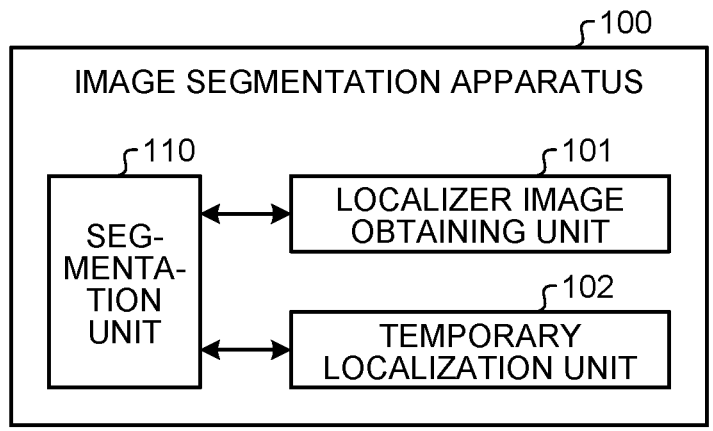
FIG. 1 is a schematic diagram illustrating an exemplary configuration of an image segmentation apparatus for magnetic resonance imaging according to the first embodiment.

An image segmentation apparatus for magnetic resonance imaging according to an embodiment includes an obtaining unit, a temporary localization unit, and a segmentation unit. The obtaining unit is configured to obtain a localizer image of an organ, the localizer image being three-dimensional or being in a plurality of layers and two-dimensional. The temporary localization unit is configured to temporarily localize, on the basis of the localizer image, a segment in which the organ is present in terms of the layer direction of a plurality of slices included in the localizer image. The segmentation unit is configured to obtain a segmentation result of the organ, by performing an image segmentation process on the localizer image positioned inside the segment in which the organ is present.

The embodiments described below have been conceived to solve the problems described above, and provide an image segmentation apparatus for magnetic resonance imaging, an image segmentation method, and a magnetic resonance imaging apparatus. According to at least one aspect of the embodiments, it is possible to realize a prompt segmentation of the organ in the localizer image. Further, according to at least one aspect of the embodiments, it is possible to provide complete information about the position and the size of the organ by sufficiently utilizing the prompt segmentation and to thus realize a prompt localization. Furthermore, according to at least one aspect of the embodiments, it is possible to detect, segment, and localize an asymmetric structure without being affected by the restrictions regarding structural symmetry. It is therefore possible to provide feature information such as the positions and the sizes of multiple organs in a three-dimensional space and to provide an accurate localization, which make it possible to realize automated scan planning for the multiple organs in the abdomen. In addition, according to at least one aspect of the embodiments, it is possible to make abdomen scans standardized and more accurate and to make operational flows simplified and take less time. It is therefore possible to realize highly efficient automated scan planning, as well as automated scans and three-dimensional rendering having high capabilities, which are able to improve capabilities of magnetic resonance imaging apparatuses.

An image segmentation apparatus for magnetic resonance imaging according to one aspect of an embodiment includes: an obtaining unit configured to obtain a localizer image of an organ which is three-dimensional or is in a plurality of layers and two-dimensional; a temporary localization unit configured to temporarily localize, on the basis of the localizer image, a segment in which the organ is present in terms of a layer direction of a plurality of slices included in the localizer image; and a segmentation unit configured to obtain a segmentation result of the organ, by performing an image segmentation process on the localizer image positioned inside the segment in which the organ is present.

Further, in the image segmentation apparatus according to the one aspect of the embodiment, the temporary localization unit is configured to temporarily localize the segment in which the organ is present in terms of the layer direction, by selecting, on the basis of a search algorithm, two or more two-dimensional transversal cross-sectional images from among a plurality of two-dimensional transversal cross-sectional images obtained on the basis of the localizer image, and further performing an image segmentation process on the selected two-dimensional transversal cross-sectional images, so as to identify a two-dimensional transversal cross-sectional image corresponding to an end of the organ in terms of the layer direction.

Further, in the image segmentation apparatus according to the one aspect of the embodiment, the temporary localization unit is configured to select the two or more two-dimensional transversal cross-sectional images, by using one selected from among: a regular interval selection method, a random selection method, and a selection method based on a distribution of the organ.

Further, the image segmentation apparatus according to the one aspect of the embodiment further includes an optimizing unit configured to optimize a local feature of the organ on the basis of the segmentation result of the organ.

Furthermore, in the image segmentation apparatus according to the one aspect of the embodiment, the optimizing unit is configured to perform the optimization, by selecting a local feature region on the basis of the segmentation result of the organ and further performing a three-dimensional curved plane detection or a two-dimensional edge detection on the basis of the selected local feature region so as to calculate a position of an apex of the local feature of the organ.

For the image segmentation apparatus according to the one aspect of the embodiment, the local feature of the organ is one of six ends defining a positional range of the organ.

Further, for the image segmentation apparatus according to the one aspect of the embodiment, the layer direction is one selected from among a head-foot direction, an anterior-posterior direction, and a left-right direction.

Also, for the image segmentation apparatus according to the one aspect of the embodiment, the segmentation result of the organ is data indicating a contour, the size, and the position of the organ.

Furthermore, for the image segmentation apparatus according to the one aspect of the embodiment, the search algorithm is related to one selected from among: a linear search, a binary search, a search using a tree structure, and a hash search.

In the image segmentation apparatus according to the one aspect of the embodiment, one selected from between an image segmentation algorithm and deep learning is applied to the image segmentation process.

Also, the image segmentation apparatus according to the one aspect of the embodiment further includes: a detecting unit configured, on the basis of a plurality of two-dimensional transversal cross-sectional images obtained on the basis of the localizer image, to detect a body surface range from the two-dimensional transversal cross-sectional images, and the optimizing unit is configured to optimize the local feature of the organ on the basis of the body surface range and the segmentation result of the organ.

Furthermore, for the image segmentation apparatus according to the one aspect of the embodiment, the organ is one selected from among: the liver, one or both of the kidneys, the pancreas, the spleen, and the heart.

An image segmentation method for magnetic resonance imaging according to one aspect of an embodiment includes: a step of obtaining a localizer image of an organ which is three-dimensional or is in a plurality of layers and two-dimensional; a step of temporarily localizing, on the basis of the localizer image, a segment in which the organ is present in terms of a layer direction of a plurality of slices included in the localizer image; and a step of obtaining a segmentation result of the organ, by performing an image segmentation process on the localizer image positioned inside the segment in which the organ is present.

Further, a magnetic resonance imaging apparatus according to one aspect of an embodiment includes the aforementioned image segmentation apparatus.

Also, the magnetic resonance imaging apparatus according to the one aspect of the embodiment further includes: a localizing unit configured to localize the organ on the basis of the segmentation result of the organ.

Also, the magnetic resonance imaging apparatus according to the one aspect of the embodiment further includes: a planning unit configured to plan the position and an orientation of a scan Region Of Interest (ROI) and the size of a Field Of View (FOV), on the basis of the segmentation result of the organ.

Furthermore, the magnetic resonance imaging apparatus according to the one aspect of the embodiment further includes: a rendering unit configured to perform three-dimensional morphological rendering on the organ, on the basis of the segmentation result of the organ.

By using the image segmentation apparatus for magnetic resonance imaging, the image segmentation method, and the magnetic resonance imaging apparatus according to the certain aspects of the embodiment, it is possible to realize a prompt segmentation of the organ in the localizer image. Further, by using the image segmentation apparatus for magnetic resonance imaging, the image segmentation method, and the magnetic resonance imaging apparatus according to the certain aspects of the embodiment, it is possible to provide complete information about the position and the size of the organ by sufficiently utilizing the prompt segmentation and to thus realize a prompt localization. Further, by using the image segmentation apparatus for magnetic resonance imaging, the image segmentation method, and the magnetic resonance imaging apparatus according to the certain aspects of the embodiment it is possible to detect, segment, and localize the asymmetric structure, without being affected by the restrictions regarding structural symmetry. It is therefore possible to provide the feature information such as the positions and the sizes of multiple organs in the three-dimensional space and to provide an accurate localization, which make it possible to realize automated scan planning for the multiple organs in the abdomen. Furthermore, by using the image segmentation apparatus for magnetic resonance imaging, the image segmentation method, and the magnetic resonance imaging apparatus according to the certain aspects of the embodiment, it is possible to make abdomen scans standardized and more accurate and to make operational flows simplified and take less time. It is therefore possible to realize highly efficient automated scan planning, as well as automated scans and three-dimensional rendering having high capabilities, which are able to improve the capabilities of magnetic resonance imaging apparatuses.

Configurations and operations of an image segmentation apparatus for magnetic resonance imaging according to embodiments of the present disclosure will be explained, with reference to the accompanying drawings.

Further, the present specification and drawings will describe and indicate only certain members relevant to the techniques set forth in the present disclosure. Description and illustration of the other members will be omitted.

Furthermore, in the present specification and drawings, some of the members having functions that are the same as or similar to each other will be referred to by using the same reference characters, and the duplicate explanations thereof will be omitted, as appropriate.

First Embodiment

A Configuration of an Image Segmentation Apparatus 100

FIG. 1 is a schematic diagram illustrating an exemplary configuration of an image segmentation apparatus 100 for magnetic resonance imaging according to a first embodiment.

In the present embodiment, the term "organ" primarily denotes any of the organs in the abdomen, which may be, for example, the liver, one or both of the kidneys, the pancreas, the spleen, and/or the like. However, the organs are not limited to these examples and may be other organs such as the heart. The present embodiment will be explained by using an example in which the organ is the liver.

As illustrated in FIG. 1, the image segmentation apparatus 100 includes a localizer image obtaining unit 101, a temporary localization unit 102, and a segmentation unit 110.

The localizer image obtaining unit 101 is configured to obtain at least one image of an organ which is three-dimensional or is in a plurality of layers and two-dimensional, as a localizer image. For example, a series of abdominal images in a three-dimensional space may be obtained through a scan and used as the localizer image. A Field Of View (FOV) of the image includes an organ region (e.g., a liver region). Further, the FOV is satisfactory when including the organ region and therefore may be larger than the organ region. Alternatively, the series of abdominal images in the three-dimensional space may be two-dimensional images of a plurality of layers or may be three-dimensional volume imaging images. Further, the series of abdominal images in the three-dimensional space are a series of images arranged in the layer direction. Further, the layer direction is the direction along which slices being scanned are arranged. Further, the layer direction may be, for example, one selected from among the head-foot direction, the anterior-posterior direction, and a left-right direction of a human body.

The temporary localization unit 102 is configured to temporarily localize, on the basis of the localizer image obtained by the localizer image obtaining unit 101, a segment in which the organ is present in terms of the layer direction of the plurality of slices included in the localizer image. For example, the temporary localization unit 102 may temporarily localize the segment in which the organ is present in terms of the layer direction, by selecting, on the basis of a search algorithm, two or more two-dimensional transversal cross-sectional images from among a plurality of two-dimensional transversal cross-sectional images obtained on the basis of the localizer image, and further performing an image segmentation process on the selected two-dimensional transversal cross-sectional images so as to identify a two-dimensional transversal cross-sectional image corresponding to an end of the organ in terms of the layer direction.

In this situation, when the localizer image obtained by the localizer image obtaining unit 101 is transversal cross-sectional scan images, the localizer image may serve as the two-dimensional transversal cross-sectional images. In contrast, when the localizer image obtained by the localizer image obtaining unit 101 is not transversal cross-sectional scan images, a plurality of two-dimensional transversal cross-sectional images are obtained by performing a Multi Planar Reconstruction (MPR) on transversal cross-sectional planes on the basis of the localizer image. It is possible to use any of publicly-known methods for performing the MPR on the transversal cross-sectional planes on the basis of the localizer image, and detailed explanations thereof will be omitted.

Further, for example, the temporary localization unit 102 may select the two or more two-dimensional transversal cross-sectional images from the plurality of two-dimensional transversal cross-sectional images obtained on the basis of the localizer image, by using any of the following: a regular interval selection method, a random selection method, a selection method based on the distribution of the organ, and other search algorithms.

Further, for example, the search algorithm may be any of ordered and unordered search algorithms related to a linear search, a binary search, a search using a tree structure, a hash search, or the like or may be an algorithm for conducting a search on the basis of a statistical rule related to the distribution of the position of the liver.

The segmentation unit 110 is configured to obtain a segmentation result of the organ, by performing an image segmentation on the localizer image positioned inside the segment which was temporarily localized by the temporary localization unit 102 and in which the organ is present. In this situation, to the image segmentation process, one selected from between an image segmentation algorithm and deep learning may be applied, for example. Further, the segmentation result of the organ is data indicating a contour, the size, and the position of the organ. For example, the segmentation unit 110 may obtain the segmentation result of the organ (e.g., the liver) by performing an image segmentation process with respect to each of the two-dimensional transversal cross-sectional images from one end (e.g., a liver apex layer) to the other end (e.g., a liver bottom layer) of the organ in terms of the layer direction, i.e., by performing an organ segmentation on a transversal cross-sectional plane with respect to each of the layers. An operation performed by the image segmentation apparatus 100

Figure 2:
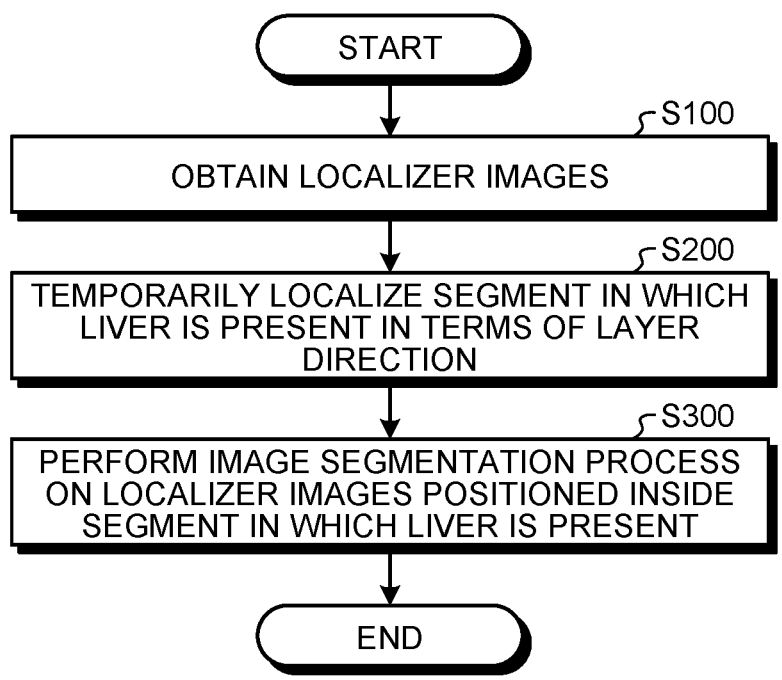
FIG. 2 is a flowchart illustrating an example of an operation performed by the image segmentation apparatus for magnetic resonance imaging according to the first embodiment.
Figure 3:
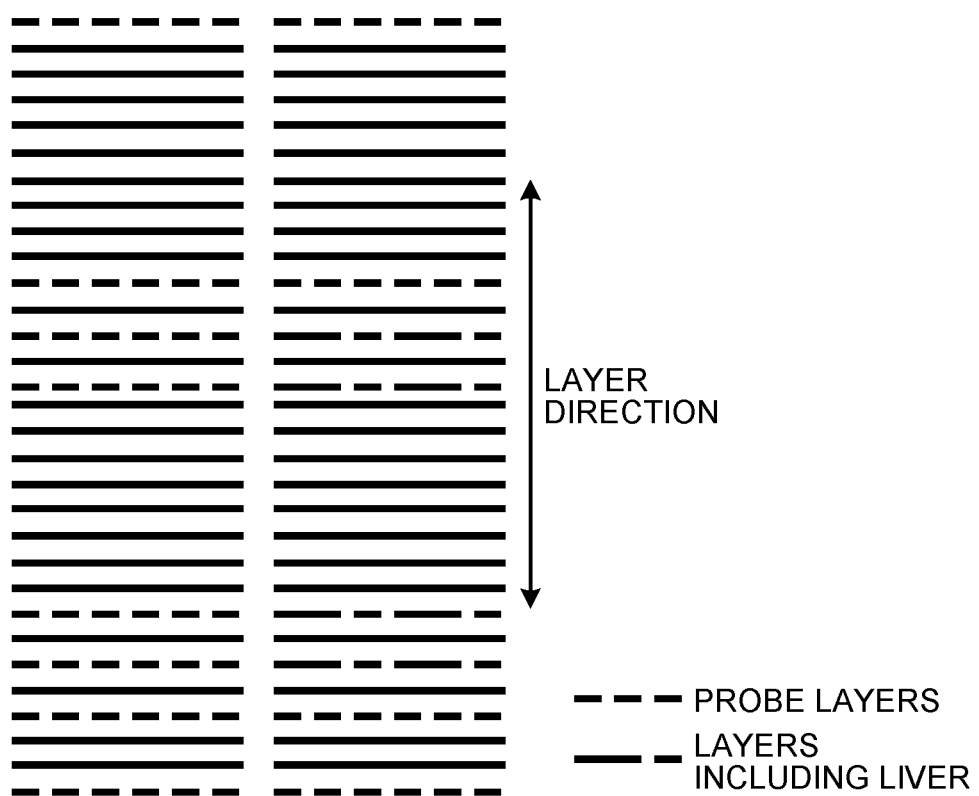
FIG. 3 is a schematic drawing illustrating an example in which a temporary localization unit of the image segmentation apparatus according to the first embodiment selects two-dimensional transversal cross-sectional images.
Figure 4:
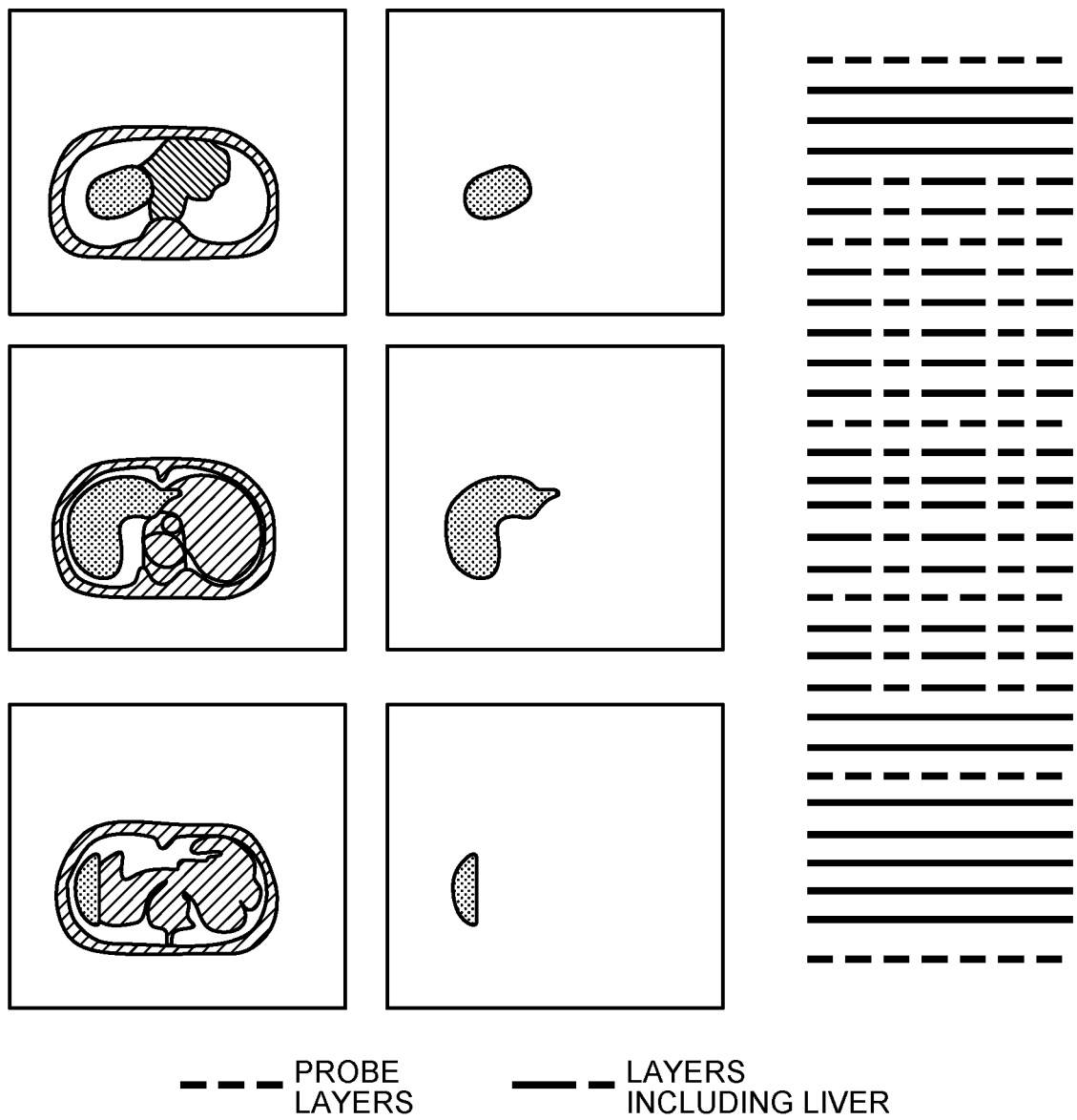
FIG. 4 is a schematic drawing illustrating an example of an image segmentation process performed by a segmentation unit of the image segmentation apparatus according to the first embodiment, on two-dimensional transversal cross-sectional images positioned inside a segment.
Figure 5:
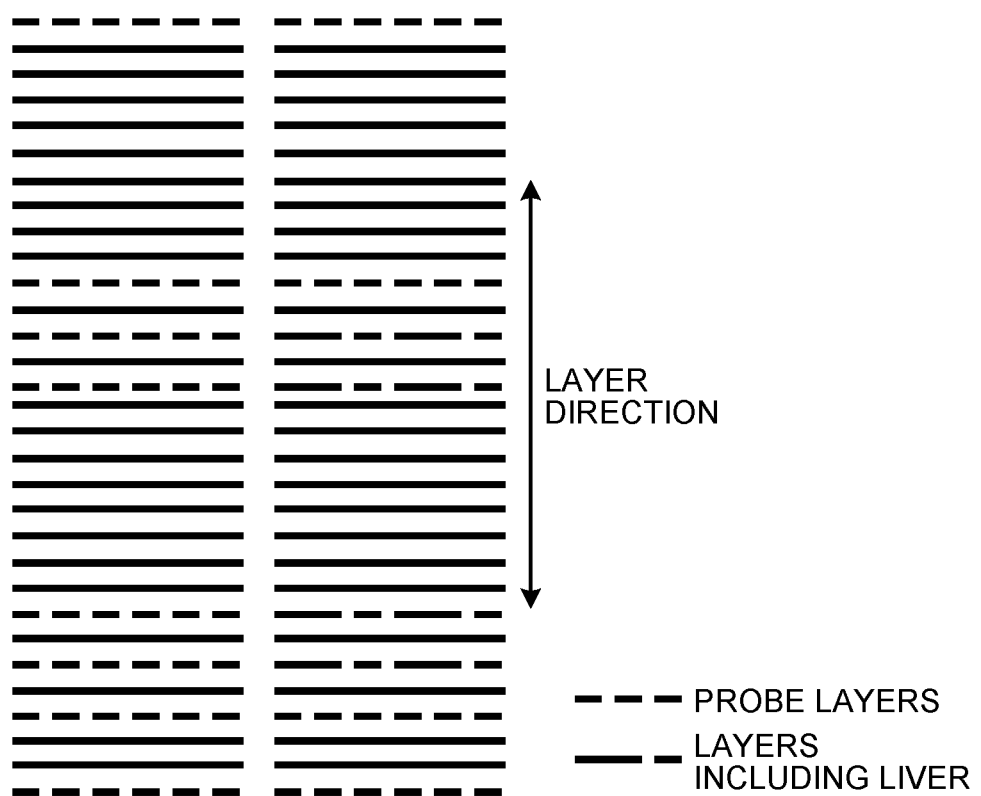
FIG. 5 is a schematic drawing illustrating another example in which the temporary localization unit of the image segmentation apparatus according to the first embodiment selects two-dimensional transversal cross-sectional images.

Next, an operation performed by the image segmentation apparatus 100 will be explained, with reference to FIGS. 2 to 5. FIG. 2 is a flowchart illustrating an example of the operation performed by the image segmentation apparatus 100 for magnetic resonance imaging according to the first embodiment. FIG. 3 is a schematic drawing illustrating an example in which the temporary localization unit 102 of the image segmentation apparatus 100 according to the first embodiment selects two-dimensional transversal cross-sectional images. FIG. 4 is a schematic drawing illustrating an example of an image segmentation process performed by the segmentation unit 110 of the image segmentation apparatus 100 according to the first embodiment, on two-dimensional transversal cross-sectional images positioned inside a segment. FIG. 5 is a schematic drawing illustrating another example in which the temporary localization unit 102 of the image segmentation apparatus 100 according to the first embodiment selects two-dimensional transversal cross-sectional images.

As illustrated in FIG. 2, in the image segmentation apparatus 100, upon the start of the operation, the localizer image obtaining unit 101 obtains, at step S100, at least one localizer image of the abdomen which is three-dimensional or is in a plurality of layers and two-dimensional. In the present example, it is assumed that the localizer image obtaining unit 101 obtains two-dimensional localizer images of the abdomen taken of 31 layers of transversal cross-sectional planes arranged in the layer direction, as illustrated in the left section and the right section of FIG. 3, for instance. The layers illustrated in FIG. 3 each represent one image, as illustrated in the top, middle, and bottom sections in the left column of FIG. 4. Further, because the present example uses the two-dimensional localizer images of the abdomen taken of the transversal cross-sectional planes, the layer direction corresponds to the head-foot direction which is the direction connecting the head to the feet.

Subsequently, at step S200, the temporary localization unit 102 temporarily localizes a segment in which the liver is present in terms of the layer direction, on the basis of the localizer images of the abdomen. More specifically, for example, the temporary localization unit 102 selects, in the first step, two-dimensional localizer images of transversal cross-sectional planes to serve as probe layers, on the basis of the two-dimensional localizer images taken of the 31 layers of the transversal cross-sectional planes obtained at step S100. After that, in the second step, the temporary localization unit 102 performs an image segmentation process of the liver on the two-dimensional localizer images of the transversal cross-sectional planes serving as the probe layers. Further, in the third step, the temporary localization unit 102 temporarily localizes the segment in which the organ is present in terms of the layer direction, by promptly searching for a liver region while using the search algorithm on the basis of the result of the image segmentation process so as to identify the layers (i.e., two-dimensional localizer images of transversal cross-sectional planes) in which the ends of the liver are present in terms of the layer direction (the head-foot direction in the present example) of the liver. After that, the temporary localization unit 102 repeatedly performs the first to the third steps while adjusting the positions of the probe layers, until the planes of the layers are identified where the ends of the liver (the liver apex and the liver bottom) are present in terms of the layer direction.

In this situation, the probe layers are representative layers. It is possible to confirm a distribution status of an organ (the liver in the present example) on the basis of a result of the segmentation process performed on probe layers positioned adjacent to each other. For example, of two probe layers positioned adjacent to each other in the layer direction, when a segmentation result of the probe layer positioned on one side in the layer direction does not include the organ region, whereas a segmentation result of the probe layer positioned on the other side in the layer direction includes the organ region, it is possible to confirm that one end of the organ in terms of the layer direction is positioned on a certain layer located between the two probe layers. In that situation, the segment defined by the two probe layers is regarded as an appearance segment. As another example, of two probe layers positioned adjacent to each other in the layer direction, when a segmentation result of the probe layer positioned on the one side in the layer direction includes the organ region, whereas a segmentation result of the probe layer positioned on the other side in the layer direction does not include the organ region, it is possible to confirm that the other end of the organ in terms of the layer direction is positioned on a certain layer located between the two probe layers. In that situation, the segment defined by the two probe layers is regarded as a disappearance segment. As yet another example, when neither of the segmentation results of two probe layers positioned adjacent to each other in the layer direction include the organ region, it is possible to confirm that the organ is not present on any of the layers located between the two probe layers. In that situation, the segment defined by the two probe layers is regarded as an absence segment. As yet another example, when segmentation results of two probe layers positioned adjacent to each other in the layer direction both include the organ region, it is possible to confirm that the organ is present on one or more of the layers located between the two probe layers. In that situation, the segment defined by the two probe layers is regarded as a presence segment.

In this situation, when selecting the probe layers, it is preferable to make selection from among appearance segments and disappearance segments. By further conducting a search on the appearance segments and the disappearance segments while using the search algorithm, it is possible to identify the liver apex layer and the liver bottom layer. Further, the selecting method may be any of various types of methods. For example, from among a plurality of two-dimensional transversal cross-sectional images obtained on the basis of the localizer images, it is acceptable to make the selection randomly, to make the selection at regular intervals, to make the selection on the basis of the distribution of the organ, or to make the selection on the basis of other data search algorithms. Further, the search algorithm may be related to a type selected from among: linear searches, binary searches, searches using a tree structure, and hash searches.

Subsequently, at step S300, the segmentation unit 110 obtains a segmentation result of the liver, by performing an image segmentation process on the localizer images positioned inside the segment in which the liver is present. More specifically, on the basis of the segment which was temporarily localized at step S200 and in which the liver is present in terms of the layer direction, i.e., the segment extending from the liver apex layer to the liver bottom layer, the segmentation unit 110 obtains the segmentation result, by performing a liver segmentation on the segment with respect to each of the layers (the two-dimensional localizer images of the transversal cross-sectional planes).

Next, an application example of the operation performed by the image segmentation apparatus 100 according to the first embodiment will be explained, with reference to FIGS. 3 and 4. For example, it is an object of the present application example to segment the liver, so that the localizer image obtaining unit 101 obtains the two-dimensional localizer images of the abdomen taken of the 31 layers of the transversal cross-sectional planes arranged in the layer direction corresponding to the head-foot direction. In the present example, the layers illustrated in FIG. 3 each represent one image as illustrated in the top, middle, and bottom sections in the left column of FIG. 4. Further, in FIGS. 3 and 4, the layers drawn with the broken lines are layers to be selected as the probe layers, whereas the layers drawn with the single-dot dashed lines are layers which will be found to include the organ in the image segmentation results.

As illustrated in FIG. 3, in the present application example, the localizer image obtaining unit 101 obtains the two-dimensional localizer images of the abdomen taken of the 31 layers of the transversal cross-sectional planes arranged in the layer direction. After that, for example, the temporary localization unit 102 selects a layer nearest to the head side and a layer nearest to the foot side as probe layers, and further selects six probe layers (the broken-line layers in the left section of FIG. 3) by using the regular-interval selection method and performs an image segmentation process on each of the probe layers. In other words, the temporary localization unit 102 performs the image segmentation process on the two-dimensional images of the transversal cross-sectional planes illustrated in the left section of FIG. 4. In the present example, the probe layers on which the liver region is segmented are indicated as single-dot dashed-line layers. As a result of the image segmentation process, for example, the segmentation results of four probe layers out of the eight probe layers include the liver region (the single-dot dashed-line layers in the right section of FIG. 3). As a result, as illustrated in the right section of FIG. 3, the segments are sequentially defined from the top to the bottom in the layer direction as follows: an absence segment, an appearance segment, a presence segment, a presence segment, a presence segment, a disappearance segment and an absence segment. After that, with respect to the appearance segment and the disappearance segment, the temporary localization unit 102 further sets probe layers and conducts a search by using the search algorithm and thus identifies a liver apex layer (the first single-dot dashed-line layer from the top in FIG. 4) and a liver bottom layer (the first single-dot dashed-line layer from the bottom in FIG. 4). After that, the segmentation unit 110 segments each of the layer planes positioned inside the segment defined by the liver apex layer and the liver bottom layer so as to obtain, as a segmentation result of the liver, information such as a contour, the position, and the size of the liver in the three-dimensional space (see the drawings in the middle column of FIG. 4). Besides, in the example illustrated in FIG. 3, the layer nearest to the head side and the layer nearest to the foot side may not be selected as the probe layers.

As explained above, in the image segmentation apparatus 100 for magnetic resonance imaging according to the first embodiment, the localizer image obtaining unit 101 is configured to obtain at least one localizer image of the organ which is three-dimensional or is in the plurality of layers and two-dimensional. Further, on the basis of the localizer images, the temporary localization unit 102 is configured to temporarily localize the segment in which the organ is present in terms of the layer direction. After that, the segmentation unit 110 is configured to obtain the segmentation result of the organ, by performing the image segmentation process on each of the localizer images positioned inside the segment in which the organ is present. As explained herein, as a result of the process performed by the temporary localization unit 102, the segment in which the organ is present in terms of the layer direction is temporarily localized through the small amount of image segmentation process. Subsequently, the image segmentation process is performed on each of the two-dimensional transversal cross-sectional images positioned in the segment in which the organ is present. Consequently, it is possible to promptly perform the temporary localization on the organ with the small amount of computation, to keep small the range where the image segmentation processes need to be performed, to reduce the computation amount required by the organ segmentation, to increase the processing speed, and to shorten the processing time. As another aspect, because the result of the organ segmentation is obtained by performing the image segmentation process on each of the two-dimensional transversal cross-sectional images positioned inside the segment in which the organ is present, it is possible to provide more complete spatial information about the position, the size, and the like of the organ. In other words, the image segmentation apparatus 100 according to the first embodiment is capable of promptly providing the more complete spatial information about the position, the size, and the like of the organ and is thus able to realize a prompt localization process. In addition, it is possible to detect, segment, and localize the asymmetric structure, without being affected by the restrictions regarding structural symmetry. It is therefore possible to provide the feature information such as the positions and the sizes of multiple organs in the three-dimensional space as well as an accurate localization, which are able to improve capabilities of magnetic resonance imaging apparatuses.

Further, with reference to FIG. 3, the example was explained in which the probe layers are selected by using the regular interval selection method, so that the segment in which the liver is present is further identified by using the image segmentation results and the search algorithm; however, the present embodiment is not limited to this example. For instance, as illustrated in FIG. 5, instead of uniformly selecting the probe layers at regular intervals, it is acceptable to select a larger number of probe layers from segments having a higher possibility of including an end of the organ and to select a smaller number of probe layers from segments with a higher possibility of having the organ successively appear and from segments having a higher possibility of not including the organ, while taking into consideration the distribution of the organ in the layer direction. Besides, in the example illustrated in FIG. 5, the layer nearest to the head side and the layer nearest to the foot side may not be selected as the probe layers. With this arrangement, it is possible to promptly perform the temporary localization on the organ with the smaller amount of computation. In addition, it is possible to keep even smaller the range where the image segmentation processes need to be performed, and to thus further reduce the computation amount required by the organ segmentation. As a result, it is possible to further increase the processing speed and to thus further shorten the processing time.

Second Embodiment

A Configuration of an Image Segmentation Apparatus 100*a*

Figure 6:
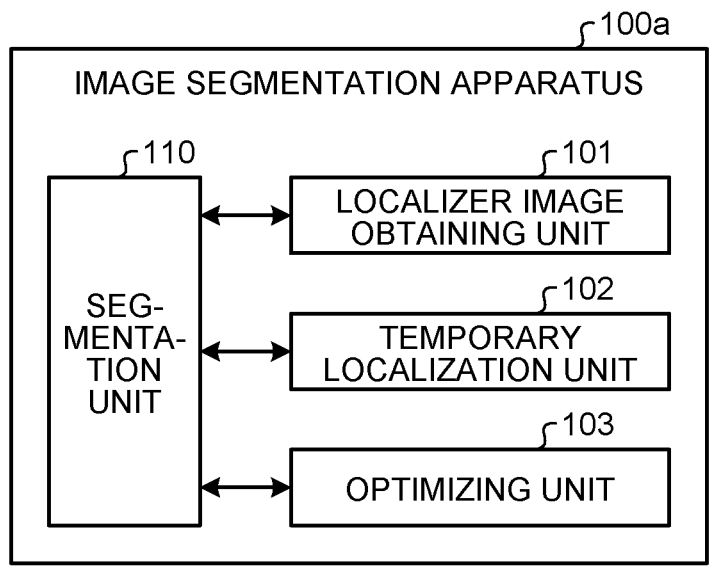
FIG. 6 is a schematic diagram illustrating an exemplary configuration of an image segmentation apparatus for magnetic resonance imaging according to a second embodiment.

FIG. 6 is a schematic diagram illustrating an exemplary configuration of an image segmentation apparatus 100*a* for magnetic resonance imaging according to a second embodiment. Similarly to the first embodiment, the present embodiment will be explained by using an example in which the organ is the liver. Further, in the present embodiment, some of the members that are the same as or similar to those in the first embodiment will be referred to by using the same reference characters, and detailed explanations thereof will be omitted. Only different sections will be explained in detail.

As illustrated in FIG. 6, the image segmentation apparatus 100*a* includes the localizer image obtaining unit 101, the temporary localization unit 102, an optimizing unit 103, and the segmentation unit 110.

Because the localizer image obtaining unit 101, the temporary localization unit 102, and the segmentation unit 110 are the same as those in the first embodiment, the explanations thereof will be omitted.

The optimizing unit 103 is configured to optimize a local feature of the organ, on the basis of the segmentation result of the organ obtained by the segmentation unit 110. In this situation, for example, the local feature of the organ is one of six ends defining a positional range of the organ. For example, the optimizing unit 103 may perform the optimization, by selecting a local feature region on the basis of the segmentation result of the organ and further performing a three-dimensional curved plane detection or a two-dimensional edge detection on the basis of the selected local feature region so as to calculate the position of an apex of the local feature of the organ. In this situation, for example, the apex may be the center or the center of gravity of the local feature region or may be another boundary point obtained by using a calculation method such as weighted addition.

Further, when the liver is used as an example, because the liver is positioned near the diaphragm, the liver is impacted by movements of the diaphragm. For this reason, when it is necessary to take into consideration impacts of respiration on the position of the liver apex, higher requirements are imposed on edges and boundary points. It is therefore necessary to more accurately detect a liver apex region and to identify the position of the apex of the liver apex region with a high level of precision. Further, when it is necessary to determine a morphological size of the liver, for example, to assess enlargement of the liver, it is required to measure the distance between the liver apex and the liver bottom. In that situation, it is necessary to detect also the liver bottom with a higher level of precision so as to precisely identify the position of an apex in the liver bottom region. It is desirable to apply the optimizing unit 103 to these situations.

An Operation Performed by the Image Segmentation Apparatus 100*a*

Figure 7:
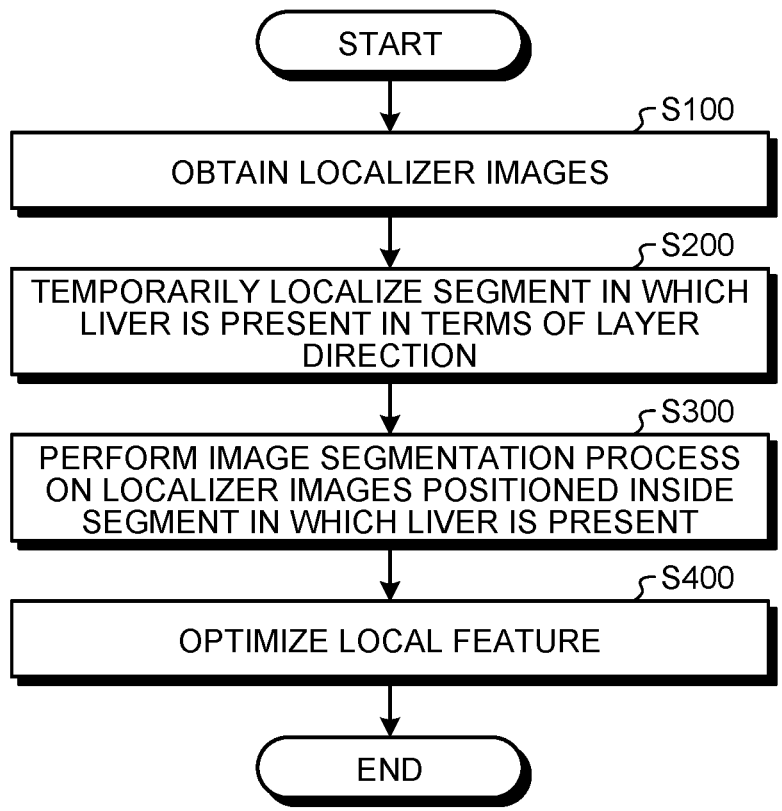
FIG. 7 is a flowchart illustrating an example of an operation performed by the image segmentation apparatus for magnetic resonance imaging according to the second embodiment.
Figure 8:
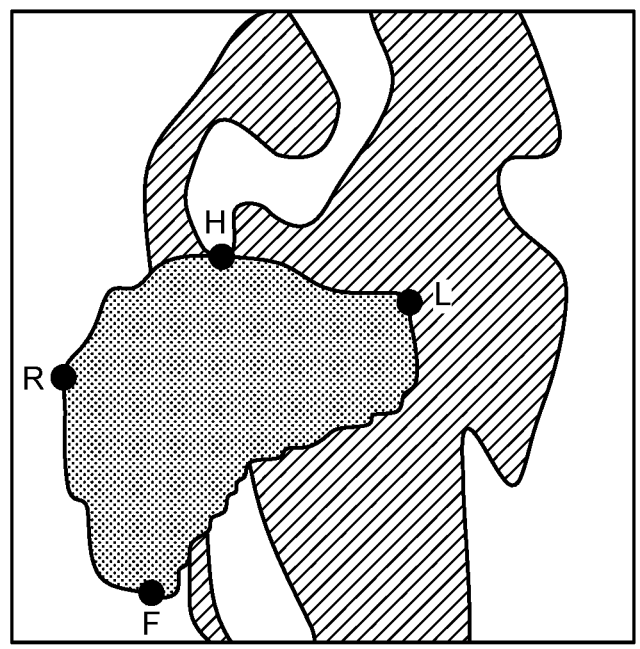
FIG. 8 is a schematic drawing illustrating an example of a local feature on which an optimizing unit of the image segmentation apparatus according to the second embodiment performs an optimizing process.
Figure 9:
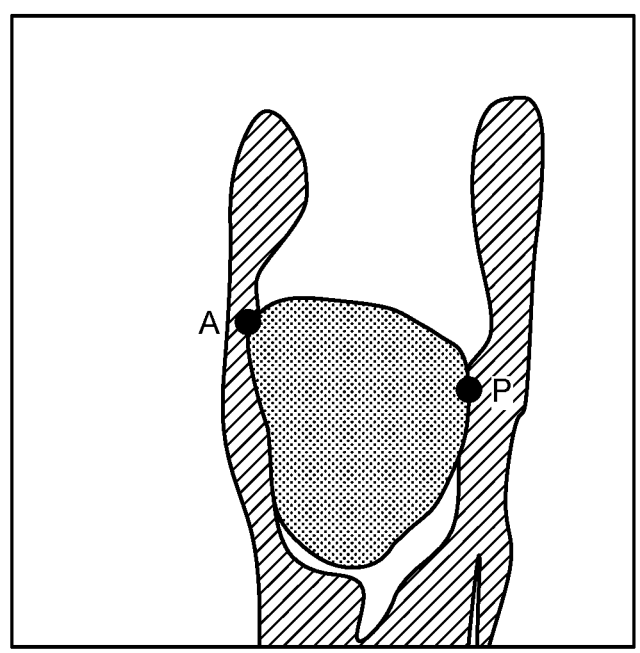
FIG. 9 is a schematic drawing illustrating another example of a local feature on which the optimizing unit of the image segmentation apparatus according to the second embodiment performs an optimizing process.
Figure 10:
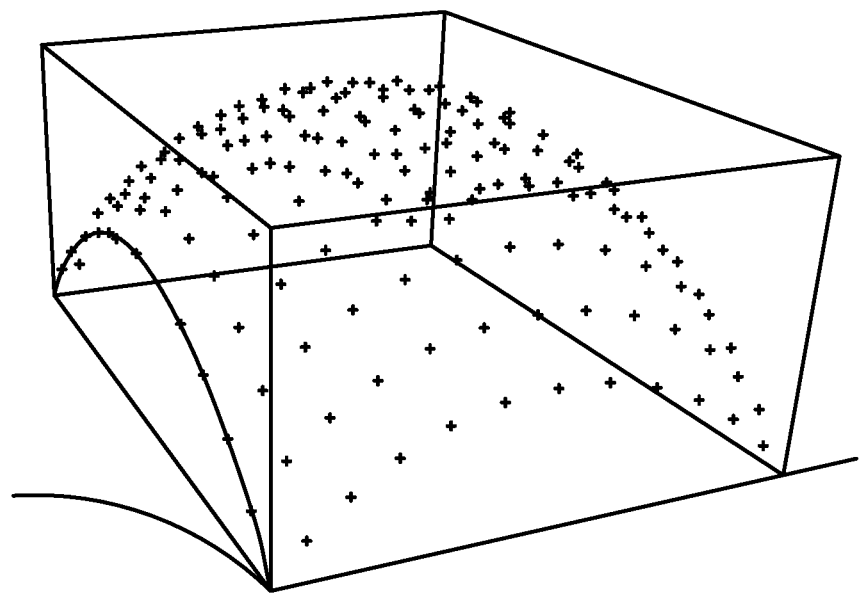
FIG. 10 is a schematic drawing illustrating an example of the optimizing processes performed by the optimizing unit of the image segmentation apparatus according to the second embodiment.

Next, an operation performed by the image segmentation apparatus 100*a* will be explained with reference to FIGS. 7 to 10. FIG. 7 is a flowchart illustrating an example of the operation performed by the image segmentation apparatus 100*a* for magnetic resonance imaging according to the second embodiment. FIG. 8 is a schematic drawing illustrating an example of a local feature on which the optimizing unit 103 of the image segmentation apparatus 100*a* according to the second embodiment performs an optimizing process. FIG. 9 is a schematic drawing illustrating another example of a local feature on which the optimizing unit 103 of the image segmentation apparatus 100*a* according to the second embodiment performs an optimizing process. FIG. 10 is a schematic drawing illustrating an example of the optimizing processes performed by the optimizing unit 103 of the image segmentation apparatus 100*a* according to the second embodiment.

Because steps S100 through S300 in FIG. 7 are the same as steps S100 through S300 in FIG. 2, the explanations thereof will be omitted.

As illustrated in FIG. 7, after the segmentation unit 110 obtains, at step S300, the segmentation result by performing the liver segmentation on the segment with respect to each of the layers, on the basis of the segment which was temporarily localized at step S200 and in which the liver is present in terms of the layer direction, i.e., the segment extending from the liver apex layer to the liver bottom layer, the image segmentation apparatus 100*a* does not end the process, but proceeds to step S400.

Subsequently, at step S400, the optimizing unit 103 optimizes a local feature of the liver, on the basis of the segmentation result of the liver obtained at step S300.

In this situation, the local feature of the liver is, for example, one of the six ends defining the positional range of the liver, as illustrated in FIGS. 8 and 9, namely an anterior end A, a posterior end P, a right end R, a left end L, an apex end (which may also be referred to as a "liver apex boundary point") H, and a bottom end (which may also be referred to as a "liver bottom boundary point") F.

More specifically, to begin with, on the basis of the segmentation result of the liver, the optimizing unit 103 extracts the liver apex boundary point H. After that, while using the extracted liver apex boundary point H as a reference point, the optimizing unit 103 selects a small region at the liver apex as a local feature region, on the basis of the size and the position of the liver region of the patient and the size and the position of a body contour. Subsequently, for example, as illustrated in FIG. 10, the optimizing unit 103 reconstructs a liver apex curved plane serving as the liver apex layer, by performing a three-dimensional curve plane detection or a two-dimensional edge detection within the selected local feature region. Subsequently, on the basis of a threshold value set in accordance with clinical requirements for a precision level, the optimizing unit 103 selects a liver apex curved plane or a set of liver apex curved planes structured with a number of adjacently-positioned layers. After that, on the basis of the selected liver apex curved plane or the selected set of liver apex curved planes, the optimizing unit 103 comprehensively calculates the center position of the liver apex and thus completes the optimization. In this situation, as a specific calculation method for calculating the center position of the liver apex, for example, it is possible to use a method for calculating the center, the center of gravity, a weighted average, or the like of multiple points.

Further, although the example using the liver apex boundary point H was explained above, the optimizing unit 103 may perform the optimization by applying the same method to the other ends of the liver.

As explained above, the image segmentation apparatus 100a for magnetic resonance imaging according to the second embodiment includes, in addition to the configuration of the first embodiment, the optimizing unit 103 configured to perform the optimization by more precisely detecting the local feature of the organ on the basis of the segmentation result of the organ. Consequently, in addition to the same advantageous effects as those of the first embodiment, it is possible to provide more accurate and precise feature information (e.g., the position and the size) of the organ in the three-dimensional space and to also realize a more accurate localization of the organ in the three-dimensional space. It is therefore possible to further improve the capabilities of magnetic resonance imaging apparatuses.

Third Embodiment

A Configuration of an Image Segmentation Apparatus 100b

Figure 11:
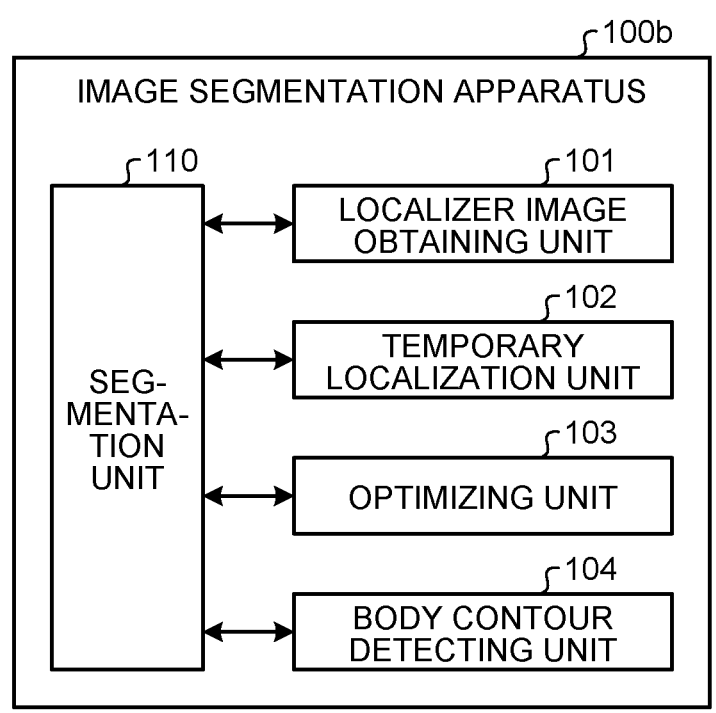
FIG. 11 is a schematic diagram illustrating an exemplary configuration of an image segmentation apparatus for magnetic resonance imaging according to a third embodiment.

FIG. 11 is a schematic diagram illustrating an exemplary configuration of an image segmentation apparatus 100b for magnetic resonance imaging according to a third embodiment. The present embodiment will be explained by using an example in which the organ is the liver, similarly to the first and the second embodiments. Further, in the present embodiment, some of the members that are the same as or similar to those in the first or the second embodiment will be referred to by using the same reference characters, and detailed explanations thereof will be omitted. Only different sections will be explained in detail.

As illustrated in FIG. 11, the image segmentation apparatus 100b includes the localizer image obtaining unit 101, the temporary localization unit 102, the optimizing unit 103, a body contour detecting unit 104, and the segmentation unit 110.

Because the localizer image obtaining unit 101, the temporary localization unit 102, and the segmentation unit 110 are the same as those in the first and the second embodiments, the explanations thereof will be explained.

On the basis of a plurality of two-dimensional transversal cross-sectional images obtained on the basis of the localizer images obtained by the localizer image obtaining unit 101, the body contour detecting unit 104 is configured to detect a body surface range from the two-dimensional transversal cross-sectional images.

Figure 12:
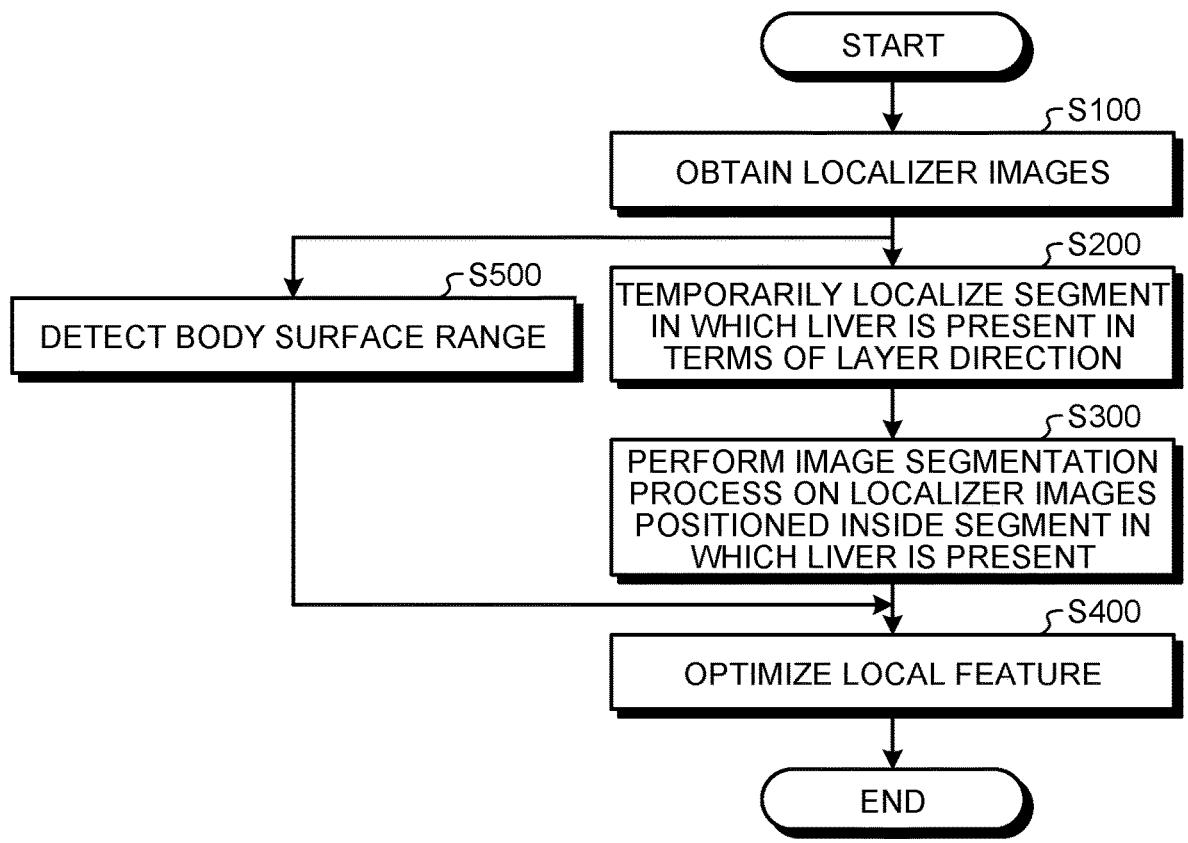
FIG. 12 is a flowchart illustrating an example of an operation performed by the image segmentation apparatus for magnetic resonance imaging according to the third embodiment.
Figure 13:
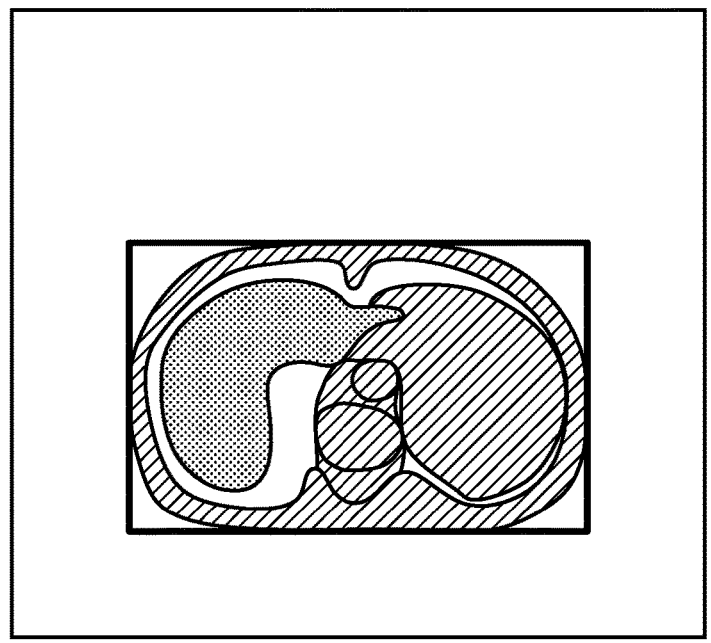
FIG. 13 is a schematic drawing illustrating an example of a detecting process performed by a body contour detecting unit of the image segmentation apparatus according to the third embodiment.

After that, in the present embodiment, the optimizing unit 103 is configured to optimize a local feature of the organ, on the basis of the body surface range detected by the body contour detecting unit 104 and the segmentation result of the organ obtained by the segmentation unit 110. An operation performed by the image segmentation apparatus 100b Next, an operation performed by the image segmentation apparatus 100b will be explained, with reference to FIGS. 12 and 13. FIG. 12 is a flowchart illustrating an example of the operation performed by the image segmentation apparatus 100b for magnetic resonance imaging according to the third embodiment. FIG. 13 is a schematic drawing illustrating an example of a detecting process performed by the body contour detecting unit 104 of the image segmentation apparatus 100b according to the third embodiment.

Because steps S100 through S300 in FIG. 12 are the same as steps S100 through S300 in FIG. 2, explanations thereof will be omitted.

As illustrated in FIG. 12, in the image segmentation apparatus 100h, at step S500, on the basis of the plurality of two-dimensional transversal cross-sectional images obtained from the position localizer images obtained at step S100, the body contour detecting unit 104 detects a body surface range from the two-dimensional transversal cross-sectional images. For example, as indicated by the bold box in FIG. 13, a box that is in contact with the body surface in the two-dimensional transversal cross-sectional images is detected as the body surface range. In this situation, it is possible to realize a method for detecting the body surface range from the two-dimensional transversal cross-sectional images, by applying any of various publicly-known methods such as an edge detection method or a gray scale value analysis method. Thus, detailed explanations thereof will be omitted.

At step S400, the optimizing unit 103 optimizes the local feature of the liver, on the basis of the body surface range detected at step S500 and the segmentation result of the liver obtained at step S300.

As explained above, the image segmentation apparatus 100b for magnetic resonance imaging according to the third embodiment includes the body contour detecting unit 104 configured to detect the body surface contour from the two-dimensional transversal cross-sectional images, in addition to the configurations of the first and the second embodiments. Consequently, it is possible to eliminate an arm range and to promptly and efficiently localize the center of the body in the anterior-posterior left-right (APLR) directions and the range of a structure that is anatomically effective. It is therefore possible to eliminate the data that may interfere with the optimizing unit 103. As a result, in addition to the same advantageous effects as those of the first and the second embodiments, it is possible to provide more accurate and precise feature information (e.g., the position and the size) of the organ in the three-dimensional space and to also realize a more accurate localization of the organ in the three-dimensional space. It is therefore possible to further improve the capabilities of magnetic resonance imaging apparatuses.

A number of embodiments have been explained while using the example in which the organ is the liver; however, possible embodiments of the techniques set forth in the present disclosure are not limited to these examples, and the techniques may be realized in other embodiments. In the following sections, Examples 1 and 2 of an image segmentation apparatus according to another embodiment will be described.

In Examples 1 and 2, it is possible to use any of the configurations and the operation flowcharts explained in the first to the third embodiments. In the following sections, the configuration and the operation flowchart in the first embodiment will be used for the explanation.

Example 1

Figure 14:
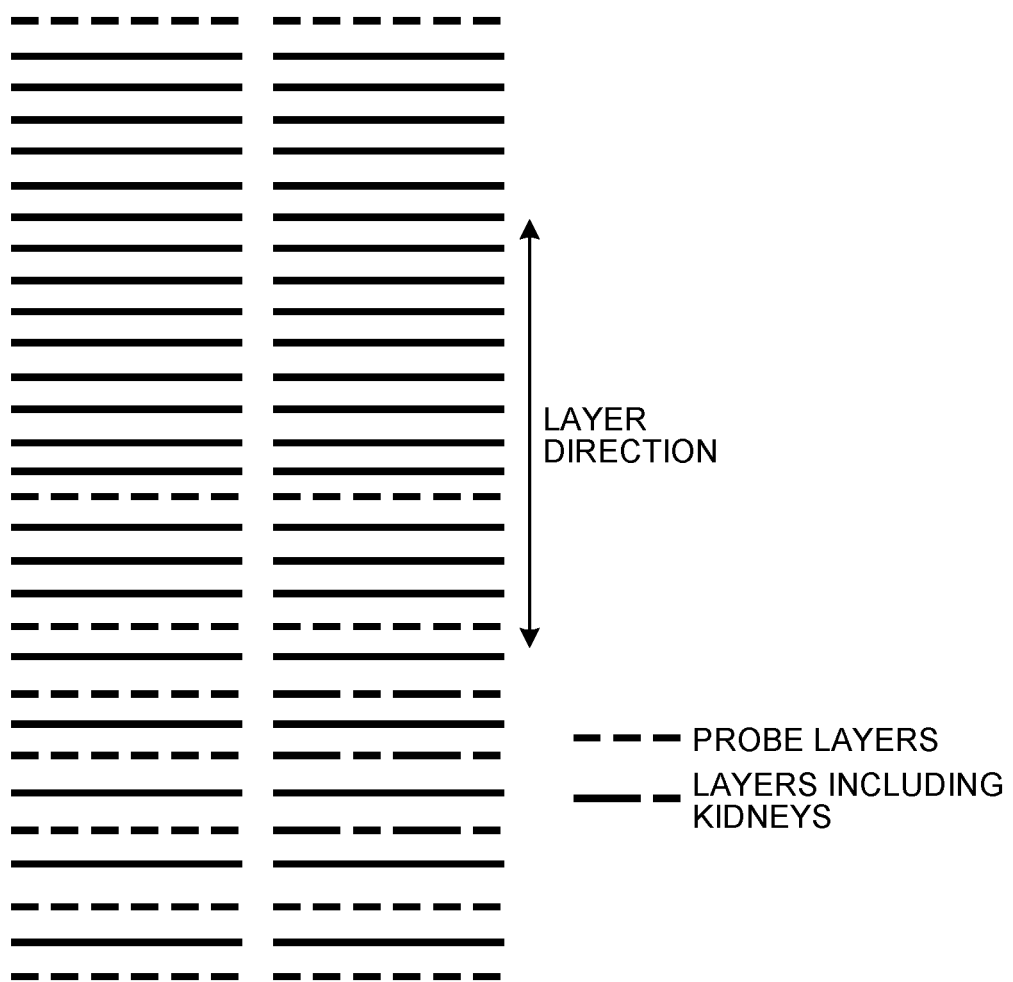
FIG. 14 is a schematic drawing illustrating Example 1 of an image segmentation apparatus for magnetic resonance imaging according to another embodiment.
Figure 15:
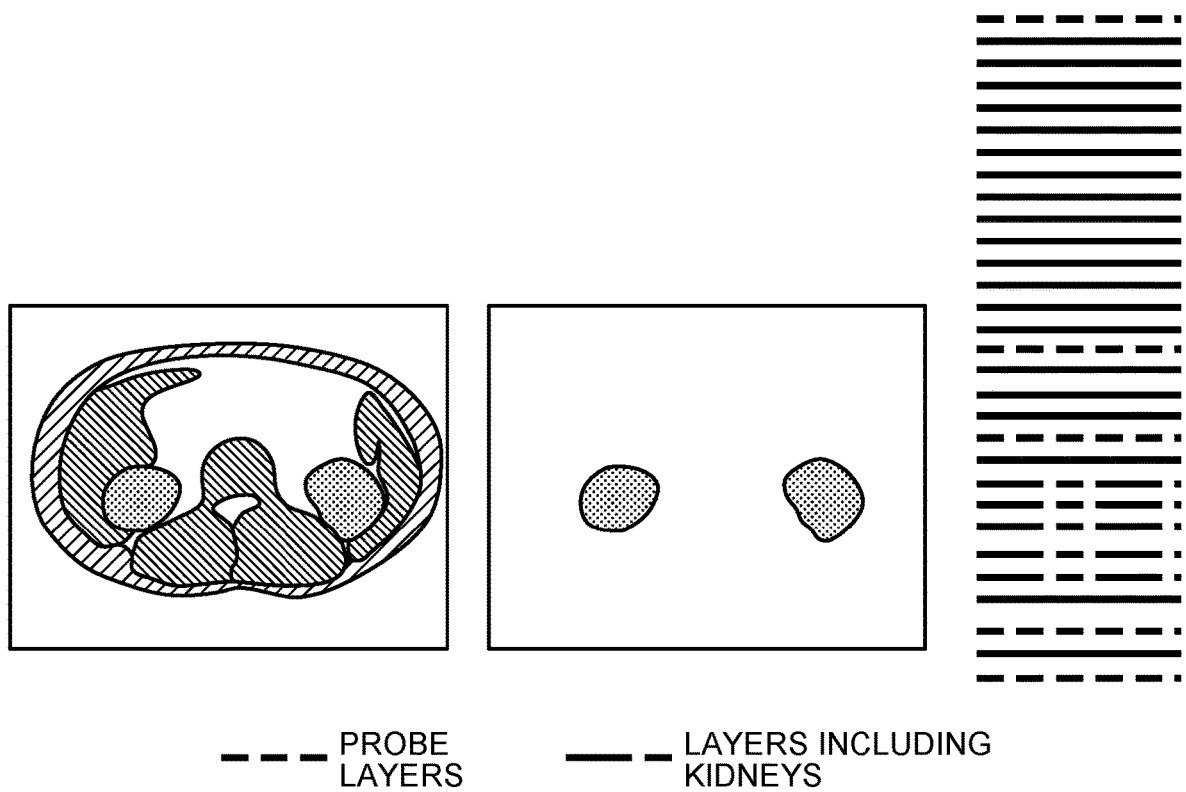
FIG. 15 is another schematic drawing illustrating Example 1 of the image segmentation apparatus for magnetic resonance imaging according to said another embodiment.

To begin with, Example 1 will be explained with reference to FIGS. 14 and 15. FIG. 14 is a schematic drawing illustrating Example 1 of an image segmentation apparatus for magnetic resonance imaging according to said another embodiment. FIG. 15 is another schematic drawing illustrating Example 1 of the image segmentation apparatus for magnetic resonance imaging according to said another embodiment.

In Example 1, as illustrated in FIG. 14, the localizer image obtaining unit 101 obtains at least one localizer image of the abdomen which is three-dimensional or is in a plurality of layers and two-dimensional being taken of an organ. In the present example, it is assumed that the localizer image obtaining unit 101 obtains two-dimensional localizer images of the abdomen taken of a plurality of layers of transversal cross-sectional planes arranged in the layer direction, as illustrated in the left section and the right section of FIG. 14, for instance. The layers illustrated in FIG. 14 each represent one image, as illustrated in the left section of FIG. 15. Further, because the present example uses the two-dimensional localizer images of the abdomen taken of the transversal cross-sectional planes, the layer direction corresponds to the head-foot direction which is the direction connecting the head to the feet. Example 1 will be explained by using an example of segmenting the kidneys.

More specifically, in Example 1, the localizer image obtaining unit 101 is configured to obtain the two-dimensional localizer images of the abdomen taken of the plurality of layers of the transversal cross-sectional planes arranged in the layer direction. In this regard, the kidneys are often distributed in a lower part of the abdomen (e.g., a section corresponding to a half to one third from the bottom). For this reason, for example, the temporary localization unit 102 is configured to densely select probe layers in the section corresponding to a half to one third from the bottom in the two-dimensional localizer images of the abdomen taken of the plurality of layers of the transversal cross-sectional planes arranged in the layer direction and to sparsely select probe layers in the other section (the broken-line layers in the left section of FIG. 14), so as to further perform an image segmentation process on each of the probe layers. In other words, the temporary localization unit 102 is configured to perform the image segmentation process on the two-dimensional images of the transversal cross-sectional planes such as the image illustrated in the left section of FIG. 15. In the present example, the probe layers on which kidney regions are segmented are indicated as single-dot dashed-line layers. As a result of the image segmentation process, for example, segmentation results of three probe layers out of the eight probe layers include kidney regions (the single-dot dashed-line layers in the right section of FIG. 14). Consequently, as illustrated in the right section of FIG. 14, the segments are sequentially defined from the top to the bottom in the layer direction as follows: an absence segment, an absence segment, an appearance segment, a presence segment, another presence segment, a disappearance segment and an absence segment. Besides, in the example illustrated in FIG. 14, the layer nearest to the head side and the layer nearest to the foot side may not be selected as the probe layers. Subsequently, the temporary localization unit 102 is configured to further set probe layers with respect to the appearance segment and the disappearance segment and to conduct a search by using the search algorithm, so as to identify a kidney apex layer (the first single-dot dashed-line layer from the top in FIG. 14) and a kidney bottom layer (the first single-dot dashed-line layer from the bottom in FIG. 14). After that, the segmentation unit 110 is configured to segment each of the layer planes positioned inside the segment defined by the kidney apex layer and the kidney bottom layer (see the single-dot dashed-line layers in FIG. 15) so as to obtain, as a segmentation result of the kidneys, information such as contours, the positions, and the sizes of the kidneys in the three-dimensional space (see the drawing in the middle section of FIG. 15).

As explained above, according to Example 1, it is possible to select the probe layers more accurately on the basis of the rules based on statistics about the distribution of the kidney positions, in addition to the same advantageous as those of the first embodiment. As a result, it is possible to promptly perform the temporary localization on the organ with the smaller amount of computation, to keep even smaller the range where the image segmentation processes need to be performed, and to further reduce the computation amount required by the organ segmentation. It is therefore possible to further increase the processing speed and to further shorten the processing time.

Example 2

Figure 16:
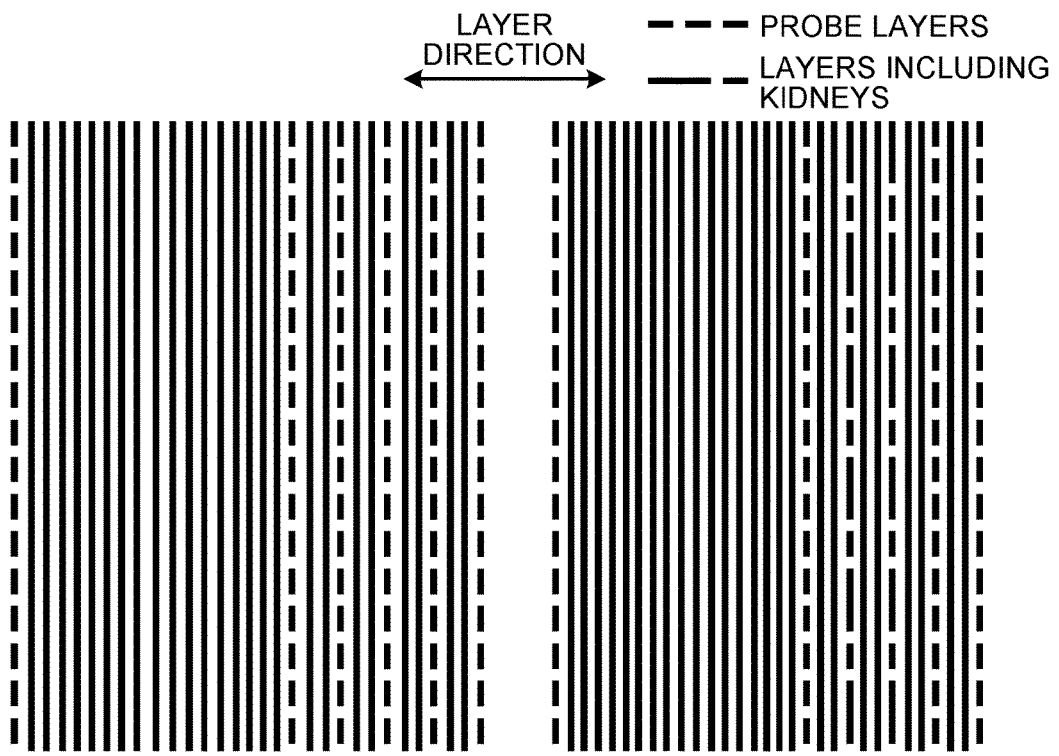
FIG. 16 is a schematic drawing illustrating Example 2 of the image segmentation apparatus for magnetic resonance imaging according to said another embodiment.
Figure 17:
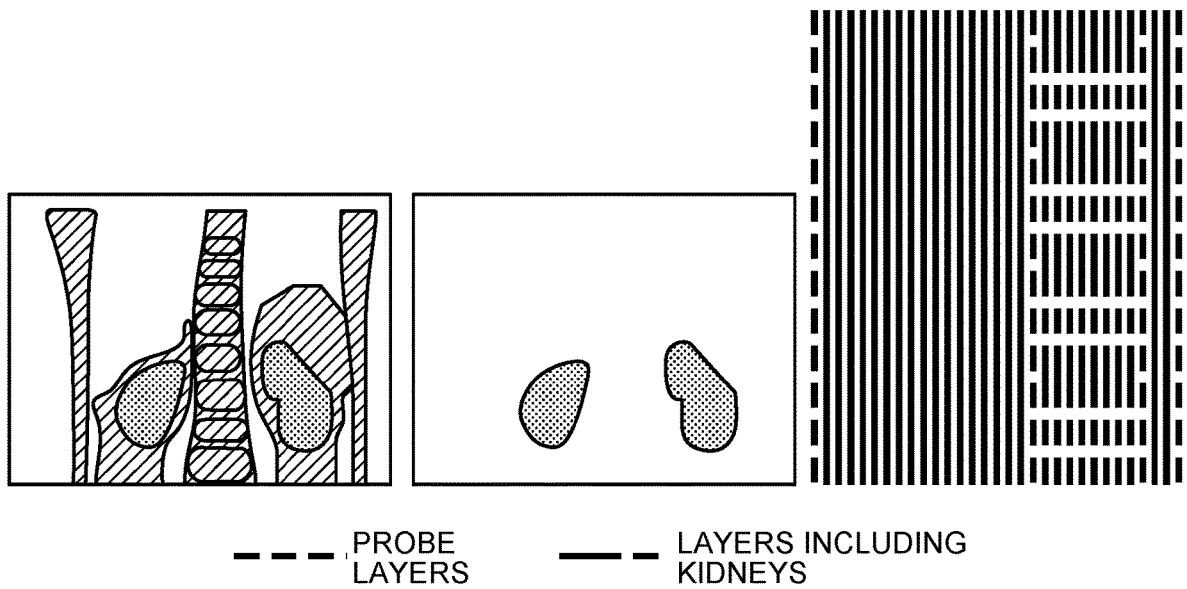
FIG. 17 is another schematic drawing illustrating Example 2 of the image segmentation apparatus for magnetic resonance imaging according to said another embodiment.

Next, Example 2 will be explained with reference to FIGS. 16 and 17. FIG. 16 is a schematic drawing illustrating Example 2 of the image segmentation apparatus for magnetic resonance imaging according to said another embodiment. FIG. 17 is another schematic drawing illustrating Example 2 of the image segmentation apparatus for magnetic resonance imaging according to said another embodiment.

In Example 2, as illustrated in FIG. 15, the localizer image obtaining unit 101 is configured to obtain at least one localizer image of the abdomen which is three-dimensional or is in a plurality of layers and two-dimensional being taken of an organ. In the present example, it is assumed that the localizer image obtaining unit 101 is configured to obtain two-dimensional localizer images of the abdomen taken of a plurality of layers of coronal planes arranged in the layer direction as illustrated in the left section and the right section of FIG. 16, for instance. The layers in FIG. 16 each represent one image as illustrated in the left section of FIG. 17. Because the present example uses the two-dimensional localizer images of the abdomen taken of the coronal planes, the layer direction corresponds to the anterior-posterior direction which is the direction connecting the anterior side and the posterior side of the body. Example 2 will be explained by using an example of segmenting the kidneys.

More specifically, in Example 2, the localizer image obtaining unit 101 is configured to obtain the two-dimensional localizer images of the abdomen taken of the plurality of layers of the coronal planes arranged in the layer direction. In this situation, the kidneys are often distributed in a rear part of the abdomen (e.g., a section at two-fifths from the posterior side). For this reason, for example, the temporary localization unit 102 is configured to densely select probe layers in the section corresponding to two-fifths from the posterior side in the two-dimensional localizer images of the abdomen taken of the plurality of layers of the coronal planes arranged in the layer direction and to sparsely select probe layers in the other section (the broken-line layers in the left section of FIG. 16), so as to further perform an image segmentation process on the probe layers. In other words, the temporary localization unit 102 is configured to perform the image segmentation process on the two-dimensional images of the coronal planes such as the image illustrated in the left section of FIG. 17. In the present example, the probe layers on which the kidney regions are segmented are indicated as single-dot dashed-line layers. As a result of the image segmentation process, for example, segmentation results of two probe layers out of the six probe layers include the kidney regions (the single-dot dashed-line layers in the right section of FIG. 16). Consequently, as illustrated in the right section of FIG. 16, the segments are sequentially defined from the anterior side to the posterior side in the layer direction as follows: an absence segment, an appearance segment, a presence segment, a disappearance segment, and an absence segment. Besides, in the example illustrated in FIG. 16, the layer nearest to the anterior side and the layer nearest to the posterior side may not be selected as the probe layers. Subsequently, the temporary localization unit 102 is configured to further set probe layers with respect to the appearance segment and the disappearance segment and to conduct a search by using the search algorithm, so as to identify a kidney anterior layer (the first single-dot dashed-line layer from the left in FIG. 17) and a kidney posterior layer (the first single-dot dashed-line layer from the right in FIG. 17). After that, the segmentation unit 110 is configured to segment each of the layer planes positioned inside the segment defined by the kidney anterior layer and the kidney posterior layer (see the single-dot dashed-line layers in FIG. 17) so as to obtain, as a segmentation result of the kidneys, information such as contours, the positions, and the sizes of the kidney in the three-dimensional space (see the drawing in the middle section of FIG. 17).

As explained above, in Example 2, it is possible to promptly segment and localize the kidneys by using the localization of the coronal planes, in addition to the same advantageous effects as those of the first embodiment and Example 1.

Further, in the embodiments and Examples described above, the situations were explained in which the techniques set forth in the present disclosure are realized by the image segmentation apparatuses and the image segmentation methods. However, the techniques set forth in the present disclosure may be realized by a magnetic resonance imaging apparatus.

For example, it is possible to realize the techniques set forth in the present disclosure as a magnetic resonance imaging apparatus including any of the image segmentation apparatuses described above in the embodiments and Examples. In the following sections, an example in which techniques set forth in the present disclosure are applied to a magnetic resonance imaging apparatus will be explained as a fourth embodiment.

Fourth Embodiment

A Configuration of a Magnetic Resonance Imaging Apparatus 200

FIG. 18 is a schematic diagram illustrating an exemplary configuration of a magnetic resonance imaging apparatus according to the fourth embodiment.

As illustrated in FIG. 18, the magnetic resonance imaging apparatus 200 includes a static magnetic field magnet 1, a gradient coil 2, a gradient power source 3, a whole body radio frequency (RF) coil 4, a local RF coil 5, transmitter circuitry 6, receiver circuitry 7, an RF shield 8, a gantry 9, a couch 10, an input interface 11, a display device 12, storage 13, the image segmentation apparatus 100, and processing circuitries 14 to 17.

The static magnetic field magnet 1 is configured to generate a static magnetic field in a space inside a bore 9a included in the gantry 9. More specifically, the static magnetic field magnet 1 is formed to have a hollow and substantially circular cylindrical shape (which may have an oval cross-section orthogonal to the central axis thereof) and is configured to generate the static magnetic field in the space inside the bore 9a provided on the inner circumferential side thereof. For example, the static magnetic field magnet 1 may be a superconductive magnet, a permanent magnet, or the like. In the present example, the superconductive magnet may be structured by using, for instance, a container filled with a cooling member such as liquid helium and a superconductive coil immersed in the container.

The gradient coil 2 is arranged on the inside of the static magnetic field magnet 1 and is configured to generate gradient magnetic fields in the bore 9a included in the gantry 9. More specifically, the gradient coil 2 is formed to have a hollow and substantially circular cylindrical shape (which may have an oval cross-section orthogonal to the central axis thereof) and includes an X coil, a Y coil, and a Z coil respectively corresponding to an X-axis, a Y-axis, and a Z-axis that are orthogonal to one another. The X coil, the Y coil, and the Z coil are configured to generate the gradient magnetic fields that linearly change along the respective axial directions, on the basis of electric currents supplied thereto from the gradient power source 3. In this situation, the Z-axis is set along a magnetic flux in the static magnetic field generated by the static magnetic field magnet 1. Further, the X-axis is set along a horizontal direction orthogonal to the Z-axis. The Y-axis is set along a vertical direction orthogonal to the Z-axis. In this manner, the X-axis, the Y-axis, and the Z-axis structure an apparatus coordinate system unique to the magnetic resonance imaging apparatus 200.

By supplying the electric currents to the gradient coil 2, the gradient power source 3 is configured to cause the gradient magnetic fields to be generated. More specifically, by individually supplying the electric current to each of the X, Y, and Z coils in the gradient coil 2, the gradient power source 3 is configured to cause the gradient magnetic fields to be generated, so as to linearly change along a readout direction, a phase encode direction, and a slice direction, respectively, that are orthogonal to one another. The axis extending along the readout direction, the axis extending along the phase encode direction, and the axis extending along the slice direction structure a logical coordinate system used for defining slice regions or a volume region subject to the imaging.

More specifically, as each being superimposed on the static magnetic field generated by the static magnetic field magnet 1, the gradient magnetic fields generated along the readout direction, the phase encode direction, and the slice direction append spatial position information to NMR signals emitted from an examined subject (hereinafter, "patient") S. More specifically, the gradient magnetic field along the readout direction appends position information along the readout direction to the NMR signal, by changing the frequency of the NMR signal in accordance with the position in the readout direction. Further, the gradient magnetic field along the phase encode direction appends position information along the phase encode direction to the NMR signal, by changing the phase of the NMR signal in accordance with the position in the phase encode direction. In addition, the gradient magnetic field along the slice direction appends position information along the slice direction to the NMR signal. For example, the gradient magnetic field along the slice direction is used for determining the orientations, the thicknesses, and the quantity of slice cross-sectional planes when the slice cross-sectional planes are imaged (two-dimensional [2D] imaging) and is used for changing the phase of the NMR signal in accordance with the position in the slice direction when acquiring volume data (three-dimensional [3D] imaging).

The whole body RF coil 4 is arranged on the inner circumferential side of the gradient coil 2 and is configured to apply an RF pulse (an excitation pulse or the like) to the patient S placed in the bore 9a of the gantry 9 and to receive the NMR signal (an echo signal or the like) emitted from the patient S due to influence of the RF pulse. More specifically, the whole body RF coil 4 is formed to have a hollow and substantially circular cylindrical shape (which may have an oval cross-section orthogonal to the central axis thereof) and is configured to apply the RF pulse to the patient S placed in the bore 9a of the gantry 9, on the basis of an RF pulse signal supplied thereto from the transmitter circuitry 6. Further, the whole body RF coil 4 is configured to receive the NMR signal emitted from the patient S due to the influence of the RF pulse and to output the received NMR signal to the receiver circuitry 7. For example, the whole body RF coil 4 may be a birdcage coil or a Transverse Electromagnetic (TEM) coil.

The local RF coil 5 is arranged in the bore 9a of the gantry 9 together with the patient S at the time of imaging and is configured to receive the NMR signal emitted from the patient S. More specifically, the local RF coil 5 is prepared for each site of the patient S. At the time of imaging the patient S, the local RF coil 5 is arranged in the vicinity of the site to be imaged and is configured to receive the NMR signal emitted from the patient S due to the influence of the RF pulse applied by the whole body RF coil 4. Further, the local RF coil 5 is configured to generate NMR data by converting the received NMR signal from an analog signal into a digital signal and to output the generated NMR data to the processing circuitry 15. For example, the local RF coil 5 may be a surface coil or a phased array coil structured by combining together a plurality of surface coils as coil elements.

The transmitter circuitry 6 is configured to output the RF pulse signal corresponding to a resonance frequency (a Larmor frequency) unique to targeted atomic nuclei placed in the static magnetic field, to the whole body RF coil 4.

More specifically, the transmitter circuitry 6 includes a pulse generator, an RF generator, a modulator, and an amplifier. The pulse generator is configured to generate a waveform of the RF pulse signal. The RF generator is configured to generate an RF signal having the resonance frequency. The modulator is configured to generate the RF pulse signal by modulating the amplitude of the RF signal generated by the RF generator, with the waveform generated by the pulse generator. The amplifier is configured to amplify the RF pulse signal generated by the modulator and to output the amplified signal to the whole body RF coil 4.

The receiver circuitry 7 is configured to generate the NMR data on the basis of the NMR signal output from the whole body RF coil 4 and to output the generated NMR data to the processing circuitry 15. More specifically, the receiver circuitry 7 includes a selector, a pre-amplifier, a phase detector, and an analog/digital (A/D) converter. The selector is configured to selectively receive an input of the NMR signal output from the whole body RF coil 4. The pre-amplifier is configured to amplify the NMR signal output from the selector. The phase detector is configured to detect the phase of the NMR signal output from the pre-amplifier. The A/D converter is configured to generate the NMR data by converting an analog signal output from the phase detector into a digital signal and to output the generated NMR data to the processing circuitry 15. In this situation, the processes described as being performed by the receiver circuitry 7 do not all necessarily have to be performed by the receiver circuitry 7. One or more of the processes (e.g., the process performed by the A/D converter) may be performed by the whole body RF coil 4.

The RF shield 8 is arranged between the gradient coil 2 and the whole body RF coil 4 and is configured to shield the gradient coil 2 from the RF pulse generated by the whole body RF coil 4. More specifically, the RF shield 8 is formed to have a hollow and substantially circular cylindrical shape (which may have an oval cross-section orthogonal to the central axis thereof) and is arranged in the space on the inner circumferential side of the gradient coil 2 so as to cover the outer circumferential surface of the whole body RF coil 4.

The gantry 9 has the hollow bore 9a formed to have a substantially circular cylindrical shape (which may have an oval cross-section orthogonal to the central axis thereof) and houses therein the static magnetic field magnet 1, the gradient coil 2, the whole body RF coil 4, and the RF shield 8. More specifically, the gantry 9 houses these elements therein, while the whole body RF coil 4 is arranged on the outer circumferential side of the bore 9a; the RF shield 8 is arranged on the outer circumferential side of the whole body RF coil 4; the gradient coil 2 is arranged on the outer circumferential side of the RF shield 8; and the static magnetic field magnet 1 is arranged on the outer circumferential side of the gradient coil 2. In this situation, the space inside the bore 9a included in the gantry 9 serves an imaging region in which the patient S is placed at the time of the imaging.

The couch 10 includes a couchtop 10a on which the patient S is placed. At the time of imaging the patient S, the couchtop 10a on which the patient S is placed is moved into the bore 9a of the gantry 9. For example, the couch 10 is installed in such a manner that the longitudinal direction of the couchtop 10a extends parallel to the central axis of the static magnetic field magnet 1.

In the present example, the magnetic resonance imaging apparatus 200 has a so-called tunnel-like structure in which the static magnetic field magnet 1, the gradient coil 2, and the whole body RF coil 4 are each formed to have the substantially circular cylindrical shape; however, possible embodiments are not limited to this example. For instance, the magnetic resonance imaging apparatus 200 may have a so-called open structure in which a pair of static magnetic field magnets, a pair of gradient coils, and a pair of RF coils are arranged so as to oppose each other, while the imaging region in which the patient S is placed is interposed therebetween. In the open structure, the space interposed between the pair of static magnetic field magnets, the pair of gradient coils, and the pair of RF coils corresponds to the bore in the tunnel-like structure.

The input interface 11 is configured to receive operations to input various types of instructions and various types of information from an operator. More specifically, the input interface 11 is connected to the processing circuitry 17 and is configured to convert the input operations received from the operator into electrical signals and to output the electrical signals to the processing circuitry 17. For example, the input interface 11 is realized by using a trackball, a switch button, a mouse, a keyboard, a touchpad on which an input operation can be performed by touching an operation surface thereof, a touch screen in which a display screen and a touchpad are integrally formed, a contactless input circuit using an optical sensor, an audio input circuit, and/or the like that are used for setting image taking conditions, a scan Region Of Interest (ROI), and the like. In the present disclosure, the input interface 11 does not necessarily have to include one or more physical operational component parts such as a mouse, a keyboard, and/or the like. Examples of the input interface 11 include, for instance, electrical signal processing circuitry configured to receive an electrical signal corresponding to an input operation from an external input device provided separately from the apparatus and to output the electrical signal to a control circuit.

The display device 12 is configured to display various types of information. More specifically, the display device 12 is connected to the processing circuitry 17 and is configured to convert data of various types of information sent thereto from the processing circuitry 17 into display-purpose electrical signals and to output the electrical signals. For example, the display device 12 is realized by using a liquid crystal monitor, a Cathode Ray Tube (CRT) monitor, a touch panel, or the like.

The storage 13 is configured to store various types of data therein. More specifically, the storage 13 is connected to the processing circuitries 14 to 17 and is configured to store therein various types of data input and output by the processing circuitries. For example, the storage 13 is realized by using a semiconductor memory element such as a Random Access Memory (RAM) or a flash memory, or a hard disk, an optical disk, or the like.

The processing circuitry 14 includes a couch controlling function 14a. The couch controlling function 14a is configured to control operations of the couch 10 by outputting control-purpose electrical signals to the couch 10. For example, via the input interface 11, the couch controlling function 14a is configured to receive, from the operator, an instruction to move the couchtop 10a in a longitudinal direction, an up-and-down direction, or a left-right direction and to bring a moving mechanism of the couchtop 10a included in the couch 10 into operation, so as to move the couchtop 10a according to the received instruction.

The processing circuitry 15 includes an acquiring function 15a. The acquiring function 15a is configured to acquire k-space data of the patient S on the basis of an imaging sequence output from the processing circuitry 17. More specifically, the acquiring function 15a is configured to acquire the NMR data by driving the gradient power source 3, the transmitter circuitry 6, the receiver circuitry 7, and the local RF coil 5, according to any of various types of imaging sequences output from the processing circuitry 17. In this situation, each of the imaging sequences is information that defines: the timing with which the electric current is to be supplied by the gradient power source 3 to the gradient coil 2 and the intensity of the electric current to be supplied; the timing with which the RF pulse signal is to be supplied by the transmitter circuitry 6 to the whole body RF coil 4 and the intensity of the RF pulse signal to be supplied; the timing with which the NMR signal is sampled by the receiver circuitry 7; and the like. Further, the acquiring function 15a is configured to store the NMR data output from the receiver circuitry 7 and the local RF coil 5 into the storage 13. In this situation, the NMR data stored in the storage 13 is stored as k-space data expressing a two- or three-dimensional k-space, as a result of having appended thereto the position information along the directions of the readout direction, the phase encode direction, and the slice direction, by the gradient magnetic fields explained above.

The processing circuitry 16 includes a generating function 16a. The generating function 16a is configured to generate an image from the k-space data of the patient S acquired by the acquiring function 15a of the processing circuitry 15. More specifically, the generating function 16a configured to generate a two- or three-dimensional image by reading the k-space data acquired by the acquiring function 15a of the processing circuitry 15 from the storage 13 and performing a reconstruction process such as a Fourier transform on the read k-space data. After that, the generating function 16a is configured to store the generated image into the storage 13.

The processing circuitry 17 is configured to receive an input of the image taking conditions from the operator via the input interface 11 and to generate the imaging sequence used for acquiring the k-space data of the patient S on the basis of the input image taking conditions. Further, by outputting the generated imaging sequence to the processing circuitry 15, the processing circuitry 17 is configured to cause the acquiring function 15a of the processing circuitry 15 to acquire the k-space data. In addition, the processing circuitry 17 is configured to control the processing circuitry 16 so as to reconstruct the image from the k-space data acquired by the acquiring function 15a of the processing circuitry 15. Furthermore, the processing circuitry 17 is configured to read any of the images stored in the storage 13 in response to a request from the operator and to cause the display device 12 to display the read image.

In this situation, for example, each of the processing circuitries 14 to 17 is realized by using a processor. In that situation, processing functions of the processing circuitries are stored in the storage 13 in the form of computer-executable programs, for example. Further, the processing circuitries are configured to realize the processing functions corresponding to the programs, by reading and executing the programs from the storage 13. In other words, the processing circuitries that have read the programs have the processing functions illustrated within the processing circuitries in FIG. 18.

Further, the processing circuitries 14 to 17 do not each necessarily have to be realized by using a single processor. For example, it is also acceptable to structure each of the processing circuitries by combining together a plurality of independent processors so that each of the processing functions is realized as a result of the processors executing a corresponding program. Further, the processing functions of the processing circuitries may be realized as being distributed among or integrated into one or more processing circuitries as appropriate. Further, in the description above, the example was explained in which the single unit of storage (i.e., the storage 13) stores therein the programs corresponding to the processing functions; however, possible embodiments are not limited to this example. For instance, it is also acceptable to provide a plurality of units of storage in a distributed manner in correspondence with the processing circuitries, so that the processing circuitries read the corresponding programs from the individual storage units.

The magnetic resonance imaging apparatus 200 according to the present embodiment configured as described above includes the image segmentation apparatus 100 described above in the first embodiment. Further, although the following will explain an example using the image segmentation apparatus 100 described in the first embodiment, the present embodiment is not limited to this example. The magnetic resonance imaging apparatus 200 may include the image segmentation apparatus 100a described in the second embodiment or the image segmentation apparatus 100b described in the third embodiment.

Further, in the magnetic resonance imaging apparatus 200 according to the present embodiment, the processing circuitry 17 includes a localizing function 17a, a planning function 17b, and a rendering function 17c. In this situation, the localizing function 17a is an example of the localizing unit. The planning function 17b is an example of the planning unit. The rendering function 17c is an example of the rendering unit.

On the basis of the segmentation result of the organ obtained by the segmentation unit 110 of the image segmentation apparatus 100, the localizing function 17a is configured to localize the organ.

On the basis of the segmentation result of the organ obtained by the segmentation unit 110, the planning function 17b is configured to plan the position and an orientation of a scan ROI and the size of an FOV.

The rendering function 17c is configured to perform three-dimensional morphological rendering on the organ, on the basis of the segmentation result of the organ obtained by the segmentation unit 110.

For example, when magnetic resonance imaging is to be performed on the abdomen, the processing circuitry 17 is configured to automatically carry out scan planning for scanning a plurality of organs included in the abdomen, by employing the localizing function 17a and the planning function 17b. Further, when magnetic resonance imaging is to be performed on the abdomen, the processing circuitry 17 is configured to perform the three-dimensional morphological rendering on the organs included in the abdomen, by employing the rendering function 17c.

As explained above, the magnetic resonance imaging apparatus 200 according to the fourth embodiment includes: one of the image segmentation apparatuses described in the above embodiments and Examples; and the localizing unit configured to localize the organs on the basis of the segmentation result of the organ. With this configuration, it is possible to realize a prompt localization and to detect, segment, and localize the asymmetric structures, without being affected by restrictions regarding structural symmetry. It is therefore possible to provide the feature information such as the positions and the sizes of the multiple organs in the three-dimensional space as well as an accurate localization, which are able to improve capabilities of the magnetic resonance imaging apparatus.

Further, the magnetic resonance imaging apparatus 200 includes: one of the image segmentation apparatuses described in the above embodiments and Examples; and the planning unit configured to plan the position and an orientation of the scan ROI and the size of the FOV on the basis of the segmentation result of the organ. With this configuration, it is possible to realize the automation of the scan planning for multiple organs in the abdomen, to make abdomen scans standardized and more accurate, and to make operational flows simplified and take less time. It is therefore possible to realize highly efficient automated scan planning, as well as automated scans having high capabilities, which are able to improve the capabilities of the magnetic resonance imaging apparatus.

Further, the magnetic resonance imaging apparatus 200 includes: one of the image segmentation apparatuses described in the above embodiments and Examples; and the rendering unit configured to perform the three-dimensional morphological rendering on the organ, on the basis of the segmentation result of the organ. With this configuration, it is possible to realize the three-dimensional morphological rendering and to thus improve the capabilities of the magnetic resonance imaging apparatus.

Further, because the magnetic resonance imaging apparatus 200 includes one of the image segmentation apparatuses described in the above embodiments and Examples, it is possible to achieve the same technical advantageous effects as those of the embodiments and Examples described above.

The embodiments and Examples of the techniques set forth in the present disclosure have thus been explained. In the embodiments and Examples described above, the localizer image obtaining unit 101, the temporary localization unit 102, the segmentation unit 110, the optimizing unit 103, and the body contour detecting unit 104 may be realized by processing circuitry such as one or more processors. In that situation, the processing functions of the localizer image obtaining unit 101, the temporary localization unit 102, the segmentation unit 110, the optimizing unit 103, and the body contour detecting unit 104 are stored in the storage in the form of the computer-executable programs, for example. Further, the processing circuitry is configured to realize the processing functions corresponding to the processing units, by reading and executing the programs stored in the storage. In other words, when the processing circuitry has read the programs, the image segmentation apparatuses according to the embodiments and Examples described above have the processing functions illustrated in FIGS. 1, 6, and 11. In that situation, the processes at steps illustrated in FIGS. 2, 7, and 12 are realized, for example, as a result of the processing circuitry reading and executing the programs corresponding to the processing functions from the storage.

Further, the processing circuitry described above does not necessarily have to be realized by using a single processor and may be structured by combining together a plurality of independent processors, so that the processing functions are realized as a result of the processors executing the programs. Further, the processing functions of the processing units may be realized as being distributed among or integrated into one or more processing circuitries, as appropriate. Furthermore, the processing functions of the processing units may be realized by hardware (e.g., circuitry) alone, by software alone, or by a combination of hardware and software. In addition, although the example was explained in which the programs corresponding to the processing functions are stored in the single unit of storage, possible embodiments are not limited to this example. For instance, the programs corresponding to the processing functions may be stored in a distributed manner in a plurality of units of storage so that the processing units read and execute the programs from the storage units.

The term "processor" used in the above explanations denotes, for example, a Central Processing Unit (CPU), a Graphics Processing Unit (GPU), or circuitry such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). In this situation, instead of having the programs saved in the storage, it is also acceptable to directly incorporate the programs in the circuitry of one or more processors. In that situation, the one or more processors are configured to realize the functions by reading and executing the programs incorporated in the circuitry thereof. Further, the processors of the present embodiments do not each necessarily have to be structured as a single circuit. It is also acceptable to structure one processor by combining together a plurality of independent circuits so as to realize the function thereof.

The programs executed by the one or more processors are provided as being incorporated in advance in a Read-Only Memory (ROM), storage, or the like. The programs may be provided as being recorded on a non-transitory computer-readable storage medium such as a Compact Disk Read-Only Memory (CD-ROM), a Flexible Disk (FD), a Compact Disk Recordable (CD-R), or a Digital Versatile Disk (DVD), in a file that is in an installable or executable format for the devices. Further, the programs may be stored in a computer connected to a network such as the Internet so as to be provided or distributed as being downloaded via the network. For example, the programs are structured as modules including the processing functions described above. In actual hardware, as a result of a CPU reading and executing the programs from a storage medium such as a ROM, the modules are loaded into a main storage device so as to be generated in the main storage device.

Further, the constituent elements of the apparatuses in the drawings of the above embodiments and Examples are based on functional concepts. Thus, it is not necessarily required to physically configure the constituent elements as indicated in the drawings. In other words, specific modes of distribution and integration of the apparatuses are not limited to those illustrated in the drawings. It is acceptable to functionally or physically distribute or integrate all or a part of the apparatuses in any arbitrary units, depending on various loads and the status of use. Further, all or an arbitrary part of the processing functions performed by the apparatuses may be realized by a CPU and a program analyzed and executed by the CPU or may be realized as hardware using wired logic.

With regard to the processes explained in the embodiments and Examples described above, it is acceptable to manually perform all or a part of the processes described as being performed automatically. Conversely, by using a publicly-known method, it is also acceptable to automatically perform all or a part of the processes described as being performed manually. Further, unless noted otherwise, it is acceptable to arbitrarily modify any of the processing procedures, the controlling procedures, specific names, and various information including various types of data and parameters that are presented in the above text and the drawings.

The various types of data handled in the present disclosure are, typically, digital data.

According to at least one aspect of the embodiments described above, it is possible to realize a prompt segmentation of the organ in the localizer image.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image segmentation apparatus for magnetic resonance imaging, comprising processing circuitry configured:
   to obtain a localizer image of an organ, the localizer image being three-dimensional or being in a plurality of layers and two-dimensional;
   to obtain, on a basis of the localizer image, a plurality of two-dimensional transversal cross-sectional images arranged in a layer direction of a plurality of slices included in the localizer image;
   to identify a first two-dimensional transversal cross-sectional image and a second two-dimensional transversal cross-sectional image from among the plurality of two-dimensional transversal cross-sectional images, wherein one end of the organ in terms of the layer direction is present in the first two-dimensional transversal cross-sectional image, and another end of the organ in terms of the layer direction is present in the second two-dimensional transversal cross-sectional image;
   to temporarily localize a segment in which the organ is present in terms of the layer direction by identifying a segment defined by the first two-dimensional transversal cross-sectional image and the second two-dimensional transversal cross-sectional image; and
   to obtain a segmentation result of a region of the organ, by performing an image segmentation process on the localizer image positioned inside the segment in which the organ is present.

2. The image segmentation apparatus according to claim 1, wherein
   the processing circuitry is further configured to select, on a basis of a search algorithm, two or more two-dimensional transversal cross-sectional images from among the plurality of two-dimensional transversal cross-sectional images, and further perform an image segmentation process on the selected two-dimensional transversal cross-sectional images, so as to identify the first two-dimensional transversal cross-sectional image in which the one end of the organ is present and the second two-dimensional transversal cross-sectional image in which the another end of the organ is present.

3. The image segmentation apparatus according to claim 2, wherein
   the processing circuitry is further configured to select the two or more two-dimensional transversal cross-sectional images, by using one selected from among: a regular interval selection method, a random selection method, and a selection method based on a distribution of the organ.

4. The image segmentation apparatus according to claim 3, wherein
the search algorithm is related to one selected from among a linear search, a binary search, a search using a tree structure, and a hash search.

5. The image segmentation apparatus according to claim 1, wherein
the processing circuitry is further configured to optimize a local feature of the organ on a basis of the segmentation result of a region of the organ.

6. The image segmentation apparatus according to claim 5, wherein
the processing circuitry is further configured to perform the optimization, by selecting a local feature region on the basis of the segmentation result of a region of the organ and further performing a three-dimensional curved plane detection or a two-dimensional edge detection on a basis of the selected local feature region so as to calculate a position of an apex of the local feature of the organ.

7. The image segmentation apparatus according to claim 5, wherein
the local feature of the organ is one of six ends defining a positional range of the organ.

8. The image segmentation apparatus according to claim 5, wherein
the processing circuitry is further configured:
to detect, on a basis of a plurality of two-dimensional transversal cross-sectional images obtained on a basis of the localizer image, a body surface range from the two-dimensional transversal cross-sectional images; and
to optimize the local feature of the organ on a basis of the body surface range and the segmentation result of a region of the organ.

9. The image segmentation apparatus according to claim 1, wherein
the layer direction is one selected from among a head-foot direction, an anterior-posterior direction, and a left-right direction.

10. The image segmentation apparatus according to claim 1, wherein
the segmentation result of the region of the organ is data indicating a contour, a size, and a position of the organ.

11. The image segmentation apparatus according to claim 1, wherein
one selected from between an image segmentation algorithm and deep learning is applied to the image segmentation process.

12. The image segmentation apparatus according to claim 1, wherein
the organ is one selected from among a liver, one or both of kidneys, a pancreas, a spleen, and a heart.

13. A magnetic resonance imaging apparatus, comprising the image segmentation apparatus according to claim 1.

14. The magnetic resonance imaging apparatus according to claim 13, wherein
the processing circuitry is further configured to localize the organ on a basis of the segmentation result of a region of the organ.

15. The magnetic resonance imaging apparatus according to claim 13, wherein
the processing circuitry is further configured to perform three-dimensional morphological rendering on the organ, on a basis of the segmentation result of a region of the organ.

16. The magnetic resonance imaging apparatus according to claim 13, wherein
the processing circuitry is further configured to plan a position and an orientation of a scan Region Of Interest (ROI) and a size of a Field Of View (FOV), on a basis of the segmentation result of a region of the organ.

17. An image segmentation method for magnetic resonance imaging, comprising:
obtaining a localizer image of an organ, the localizer image being three-dimensional or being in a plurality of layers and two-dimensional;
obtaining, on a basis of the localizer image, a plurality of two-dimensional transversal cross-sectional images arranged in a layer direction of a plurality of slices included in the localizer image;
identifying a first two-dimensional transversal cross-sectional image and a second two-dimensional transversal cross-sectional image from among the plurality of two-dimensional transversal cross-sectional images, wherein one end of the organ in terms of the layer direction is present in the first two-dimensional transversal cross-sectional image, and another end of the organ in terms of the layer direction is present in the second two-dimensional transversal cross-sectional image;
temporarily localizing a segment in which the organ is present in terms of the layer direction by identifying a segment defined by the first two-dimensional transversal cross-sectional image and the second two-dimensional transversal cross-sectional image; and
obtaining a segmentation result of a region of the organ, by performing an image segmentation process on the localizer image positioned inside the segment in which the organ is present.

* * * * *